(12) United States Patent
Cheong et al.

(10) Patent No.: US 11,403,453 B2
(45) Date of Patent: Aug. 2, 2022

(54) DEFECT PREDICTION

(71) Applicant: ASML NETHERLANDS B.V., Veldhoven (NL)

(72) Inventors: Lin Lee Cheong, San Jose, CA (US); Bruno La Fontaine, Pleasanton, CA (US); Marc Jurian Kea, Morgan Hill, CA (US); Yasri Yudhistira, Cupertino, CA (US); Maxime Philippe Frederic Genin, San Mateo, CA (US)

(73) Assignee: ASML Netherlands B.V., Veldhoven (NL)

( * ) Notice: Subject to any disclaimer, the term of this patent is extended or adjusted under 35 U.S.C. 154(b) by 9 days.

(21) Appl. No.: 16/629,633

(22) PCT Filed: Jun. 20, 2018

(86) PCT No.: PCT/EP2018/066394
§ 371 (c)(1),
(2) Date: Jan. 9, 2020

(87) PCT Pub. No.: WO2019/011604
PCT Pub. Date: Jan. 17, 2019

(65) Prior Publication Data
US 2021/0150115 A1 May 20, 2021

Related U.S. Application Data

(60) Provisional application No. 62/531,702, filed on Jul. 12, 2017.

(51) Int. Cl.
*G06F 30/398* (2020.01)
*G06F 30/392* (2020.01)

(52) U.S. Cl.
CPC .......... *G06F 30/398* (2020.01); *G06F 30/392* (2020.01)

(58) Field of Classification Search
CPC .. G03F 7/705; G03F 7/70483; G03F 7/70491; G03F 7/70625; G03F 7/70633;
(Continued)

(56) References Cited

U.S. PATENT DOCUMENTS

| | | |
|---|---|---|
| 5,229,872 A | 7/1993 | Mumola |
| 5,296,891 A | 3/1994 | Vogt et al. |

(Continued)

FOREIGN PATENT DOCUMENTS

WO 2010059954 5/2010

OTHER PUBLICATIONS

International Search Report and Written Opinion issued in corresponding PCT Patent Application No. PCT/EP2018/066394, dated Sep. 21, 2018.

(Continued)

*Primary Examiner* — Binh C Tat
(74) *Attorney, Agent, or Firm* — Pillsbury Winthrop Shaw Pittman LLP

(57) ABSTRACT

A method including obtaining verified values of a characteristic of a plurality of patterns on a substrate produced by a device manufacturing process; obtaining computed values of the characteristic using a non-probabilistic model; obtaining values of a residue of the non-probabilistic model based on the verified values and the computed values; and obtaining an attribute of a distribution of the residue based on the values of the residue. Also disclosed herein are methods of computing a probability of defects on a substrate produced by the device manufacturing process, and of obtaining an attribute of a distribution of the residue of a non-probabilistic model.

20 Claims, 18 Drawing Sheets

(58) Field of Classification Search
CPC ...... G03F 7/20; G03F 7/70616; G03F 7/7065; G06F 11/3006; G06F 11/3027; G06F 11/3051; G06F 16/21; G06F 11/2094; G06F 16/00; G06F 17/40; G06F 30/392; G06F 30/398; H01L 23/49883; H01L 51/0036; H01L 51/42; H01L 23/5328; H01L 2924/00
USPC ..................................................... 716/50–56
See application file for complete search history.

(56) References Cited

U.S. PATENT DOCUMENTS

| | | |
|---|---|---|
| 5,523,193 A | 6/1996 | Nelson |
| 5,808,910 A | 9/1998 | Irie et al. |
| 5,969,441 A | 10/1999 | Loopstra et al. |
| 7,587,704 B2 | 9/2009 | Ye et al. |
| 8,200,468 B2 | 6/2012 | Ye et al. |
| 8,786,824 B2 | 7/2014 | Hansen |
| 2012/0123748 A1* | 5/2012 | Aben ............... G03F 7/705 703/2 |
| 2015/0356233 A1* | 12/2015 | Fouquet ........... G06F 30/398 438/5 |

OTHER PUBLICATIONS

Hunsche, Stefan et al.: "A new paradigm for in-line detection and control of patternig defects". Proc. of SPIE, vol. 9424, Mar. 19, 2015.

Jochemsen, Marinus et al.: "Process window limiting hot spot monitoring for high-volume manufacturing", Proc. of SPIE, vol. 9778, Mar. 8, 2016.

Wang, Fei et al.: "Process window and defect monitoring using high-throughput e-beam inspection guided by computational hot spot detection". Proc. of SPIE, vol. 9778, Mar. 24, 2016.

* cited by examiner

DEFECT PREDICTION

CROSS-REFERENCE TO RELATED APPLICATIONS

This application is the U.S. national phase entry of PCT Patent Application No. PCT/EP2018/066394, filed on Jun. 20, 2018, which claims the benefit of priority of U.S. Provisional Application No. 62/531,702 which was filed on Jul. 12, 2017 and which is incorporated herein in its entirety by reference.

TECHNICAL FIELD

The description herein relates to a device manufacturing process, such as a lithographic process, and more particularly to a method to statistically predict defects on a substrate produced by the device manufacturing process.

BACKGROUND

A lithographic apparatus can be used, for example, in the manufacture of integrated circuits (ICs) or other devices. In such a case, a patterning device (e.g., a mask) may contain or provide a pattern corresponding to an individual layer of the device ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic apparatus, one target portion at a time. In one type of lithographic apparatus, the pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively.

Prior to the device fabrication procedure of transferring the pattern from the patterning device to the substrate of the device manufacturing process, the substrate may undergo various device fabrication procedures of the device manufacturing process, such as priming, resist coating and a soft bake. After exposure, the substrate may be subjected to other device fabrication procedures of the device manufacturing process, such as a post-exposure bake (PEB), development, and a hard bake. This array of device fabrication procedures is used as a basis to make an individual layer of a device, e.g., an IC. The substrate may then undergo various device fabrication procedures of the device manufacturing process such as etching, ion-implantation (doping), metallization, oxidation, chemo-mechanical polishing, etc., all intended to finish off the individual layer of the device. If several layers are required in the device, then the whole process, or a variant thereof, is repeated for each layer. Eventually, a device will be present in each target portion on the substrate. If there is a plurality of devices, these devices are then separated from one another by a technique such as dicing or sawing, whence the individual devices can be mounted on a carrier, connected to pins, etc.

SUMMARY

Disclosed herein is a method comprising: obtaining a value of a characteristic of a pattern on a substrate produced by a device manufacturing process, using a non-probabilistic model; obtaining an attribute of a distribution of a residue of the non-probabilistic model; determining an attribute of a distribution of the characteristic based on the attribute of the distribution of the residue and on the value of the characteristic of the pattern; and determining a probability that the pattern is a defect, based on the attribute of the distribution of the characteristic.

According to an embodiment, the attribute of the distribution of the residue is a probability density function (PDF) of the residue.

According to an embodiment, the attribute of the distribution of the residue is a cumulative distribution function (CDF) of the residue.

According to an embodiment, the attribute of the distribution of the residue represents a spread of the distribution of the residue.

According to an embodiment, the attribute of the distribution of the residue is a variance or standard deviation of the distribution of the residue.

According to an embodiment, the characteristic is selected from a group consisting of a position relative to the substrate, a position relative to other patterns on the substrate, a geometric size, a geometric shape, a measure of a stochastic effect, and any combination selected therefrom.

According to an embodiment, determining the attribute of the distribution of the characteristic comprises adding the attribute of the distribution of the residue and the value of the characteristic.

According to an embodiment, the attribute of the distribution of the characteristic is a PDF of the characteristic.

According to an embodiment, determining the probability comprises integrating the PDF of the characteristic over a range of the characteristic.

According to an embodiment, the method further comprises normalizing the attribute of the distribution of the characteristic.

According to an embodiment, determining the attribute of the distribution of the characteristic is further based on a range of the characteristic in which the pattern is considered a defect.

Disclosed herein is a method comprising: obtaining verified values of a characteristic of a plurality of patterns on a substrate produced by a device manufacturing process; obtaining computed values of the characteristic using a non-probabilistic model; obtaining values of a residue of the non-probabilistic model based on the verified values and the computed values; and obtaining an attribute of a distribution of the residue based on the values of the residue.

According to an embodiment, the characteristic is selected from a group consisting of a position relative to the substrate, a position relative to other patterns on the substrate, a geometric size, a geometric shape, a measure of a stochastic effect, and any combination selected therefrom.

According to an embodiment, obtaining the verified values comprises measuring the patterns using a metrology tool or simulation using a vigorous model.

According to an embodiment, the metrology tool is configured to measure the patterns using a beam of charged particles.

According to an embodiment, obtaining the values of the residue comprises obtaining differences between the computed values and the verified values.

According to an embodiment, the attribute of the distribution of the residue is a PDF of the distribution of the residue.

According to an embodiment, the method further comprises obtaining the plurality of patterns based on shape, size, function, or spatial proximity.

Disclosed herein is a method comprising: obtaining probabilities that a set of patterns on a substrate produced by a device manufacturing process are respectively defects; determining an ordered list of patterns to be inspected based on the probabilities; and inspecting patterns in the ordered list following an order of the ordered list.

According to an embodiment, the method further comprises obtaining locations of the set of patterns.

According to an embodiment, determining the ordered list is further based on the locations.

According to an embodiment, the ordered list comprises a subset of patterns among the set of patterns, wherein patterns in the subset have higher probabilities of being defects than patterns in the set but not in the subset.

According to an embodiment, determining the ordered list is further based on an inspection throughput, an amount of time allowed for inspection, or an amount of radiation the substrate is allowed to receive during inspection.

According to an embodiment, the order is an order of descending probabilities.

According to an embodiment, determining the ordered list comprises computing a cost function that is a function of the order.

According to an embodiment, the cost function represents the probabilities, an amount of time of inspecting the set of patterns, or distances among the set of patterns.

According to an embodiment, the method further comprises updating the probabilities based on data obtained from inspecting the patterns in the ordered list.

Disclosed herein is a computer program product comprising a non-transitory computer readable medium having instructions recorded thereon, the instructions when executed by a computer system implementing any or part of the methods herein.

DETAILED DESCRIPTION

Although specific reference may be made in this text to the manufacture of integrated circuits, it should be explicitly understood that the description herein has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle", "wafer" or "die" in this text should be considered as interchangeable with the more general terms "mask" or "patterning device", "substrate" and "target portion", respectively.

In the present document, the terms "radiation" and "beam" are used to encompass all types of radiation, including ultraviolet radiation (e.g. with a wavelength of 365, 248, 193, 157 or 126 nm) and EUV (extreme ultra-violet radiation, e.g. having a wavelength in the range 5-20 nm).

Figure 1:
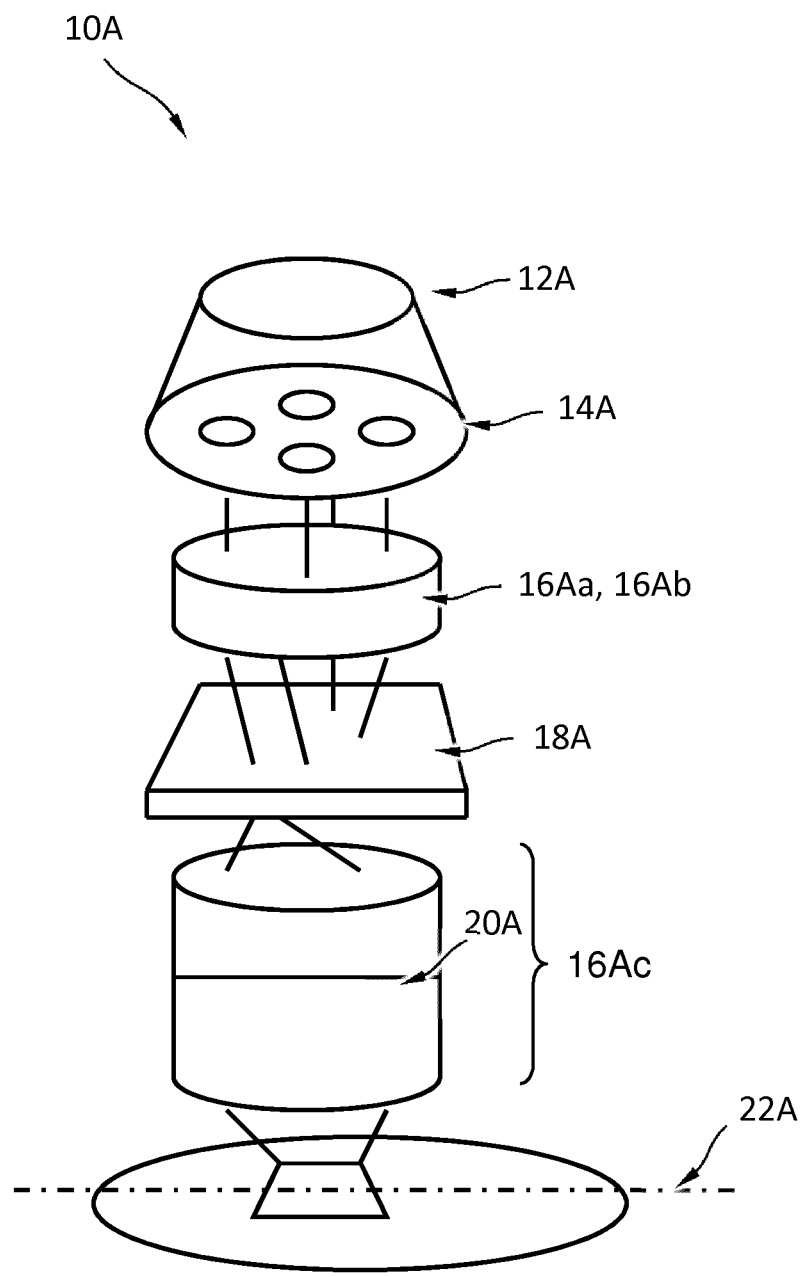
FIG. 1 is a schematic block diagram of a lithographic apparatus.

As a brief introduction, FIG. 1 highly schematically illustrates a lithographic apparatus 10A. Major components include illumination optics which define the partial coherence (denoted as sigma) and which may include components 14A, 16Aa and 16Ab that shape radiation from a radiation source 12A, which may be a deep-ultraviolet excimer laser source or other type of source including an extreme ultra-violet (EUV) source (as discussed herein, the lithographic apparatus itself need not have the radiation source); and component 16Ac that projects an image of a patterning device pattern of a patterning device 18A onto a substrate plane 22A. An adjustable filter or aperture 20A at the pupil plane of the projection optics may restrict the range of beam angles that impinge on the substrate plane 22A, where the largest possible angle $\Theta_{max}$ defines the numerical aperture of the projection optics $NA=\sin(\Theta_{max})$.

In an optical lithographic apparatus, optics direct and shape the illumination from a source via a patterning device and onto a substrate. The optics can produce an aerial image. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in U.S. Pat. No. 8,200,468, the disclosure of which is hereby incorporated by reference in its entirety. The resist model is related only to properties of the resist layer (e.g., effects of chemical processes which occur during exposure, post-exposure bake (PEB) and development). Optical properties of the lithographic apparatus (e.g., properties of the source, the patterning device and the projection optics) dictate the aerial image and can be defined in an optical model. Since the patterning device used in the lithographic apparatus can be changed, it is desirable to separate the optical properties of the patterning device from the optical properties of the rest of the lithographic apparatus including at least the source and the projection optics.

The patterns on a substrate produced by the device manufacturing process may not be all perfect. If some of the patterns are outside their respective design specification, they are considered defects. Defects may be caused by many factors. The factors may include systematic imperfection of the lithographic apparatus or other hardware used in the device manufacturing process. Defects caused by these factors alone, if these factors can be measured, may be predicted with relatively high degrees of certainty because the relationship between these factors and the patterns is definite. The factors may include random variations of the lithographic apparatus or other hardware used in the device manufacturing process. Definite prediction of defects caused by at least some of these factors may be very difficult because of the randomness of these factors. Although random variations are random, their statistics may not be. Therefore, predicting defects statistically, in other words, predicting the probabilities of defects, may be possible.

Figure 2:
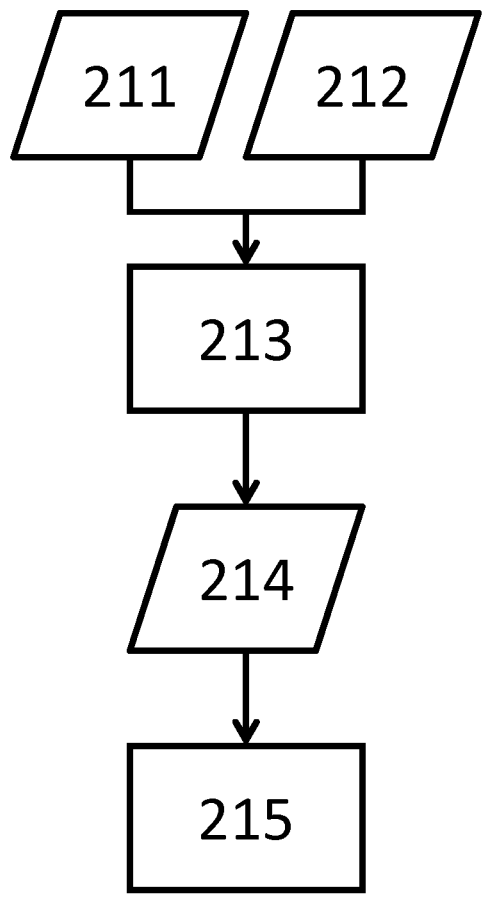
FIG. 2 schematically depicts a method of predicting defects in a device manufacturing process.

FIG. 2 schematically depicts a method of predicting defects in a device manufacturing process. Examples of a defect can include necking, line pull back, line thinning, incorrect CD, overlapping, bridging and others. A defect can be in a resist image, an optical image or an etch image (i.e., a pattern transferred to a layer of the substrate by etching using the resist thereon as a mask). At 213, a model is used to compute a characteristic 214 (e.g., the existence, location, type, shape, etc.) of a pattern, based on one or more process parameters 211 of the device manufacturing process and/or one or more layout parameters 212. The process parameters 211 are parameters associated with the device manufacturing process but not with the layout. For example, the process parameters 211 may include a characteristic of the illumination (e.g., intensity, pupil profile, etc.), a characteristic of the projection optics, dose, focus, a characteristic of the resist, a characteristic of development of the resist, a characteristic of post-exposure baking of the resist, and/or a characteristic of etching. The layout parameters 212 may include a shape, size, relative location, and/or absolute location of various features on a layout, and/or overlapping of features on different layouts. In an example, the model is an empirical model, where the pattern, which can be in a resist image, aerial image, or etch image, is not simulated; instead, the empirical model determines the characteristic 214 (e.g., the existence, location, type, shape, etc.) of the pattern based on a correlation between the input (e.g., the one or more process parameters 211 and/or layout parameters 212) of the empirical model and the characteristic. In an example, the model is a computational model, where at least a portion of the pattern is simulated and the characteristic 214 is determined from the portion, or the characteristic 214 is simulated without simulating the pattern itself. At 215, whether the pattern is a defect or whether there is a probability that the pattern is a defect is determined based on the characteristic 214. For example, a line pull back defect may be identified by finding a line end too far away from its desired location; a bridging defect may be identified by finding a location where two lines undesirably join.

Figure 3:
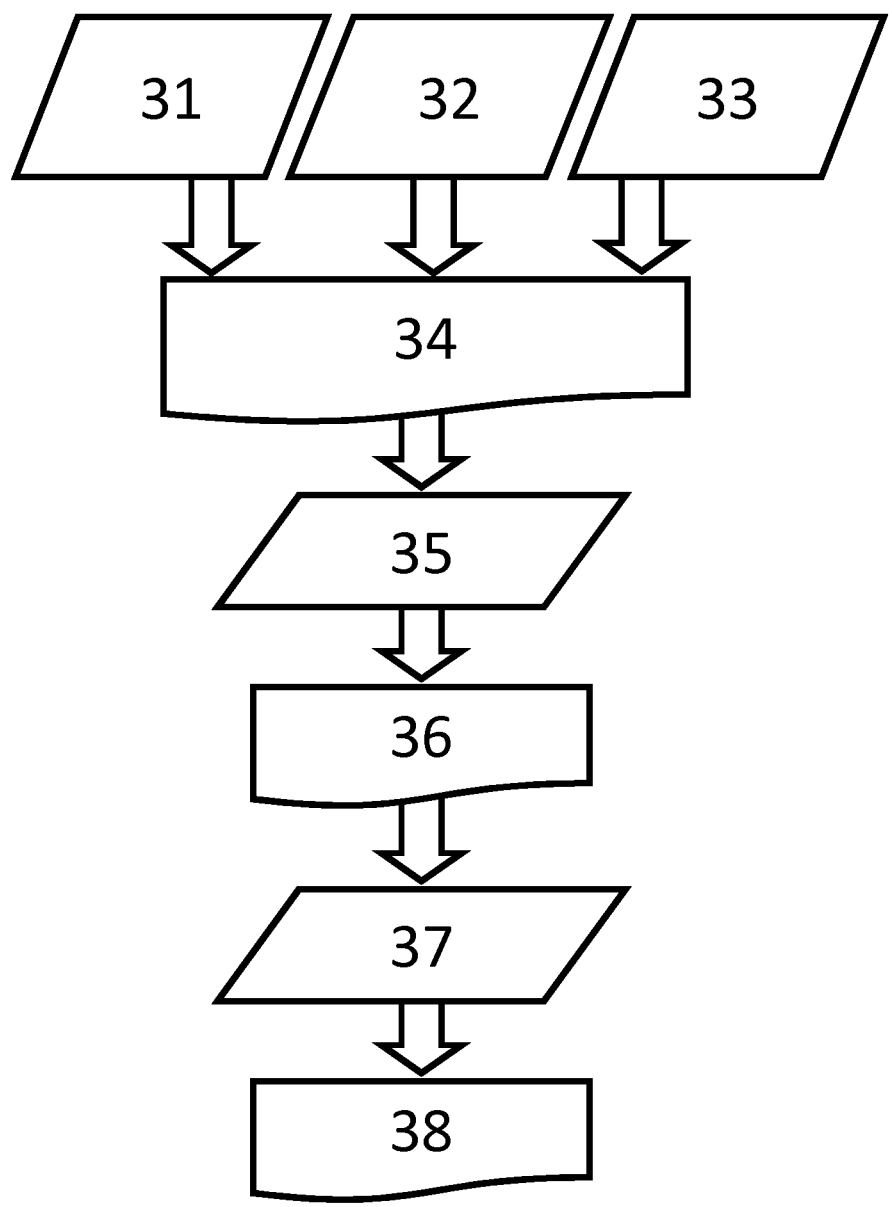
FIG. 3 illustrates a flowchart for a method of simulating at least a portion of a pattern or a characteristic of a pattern in an image.

FIG. 3 illustrates a flowchart for a method of simulating at least a portion of a pattern or a characteristic of a pattern in an image (e.g., resist image, aerial image, etch image). A source model 31 represents optical characteristics (including radiation intensity distribution and/or phase distribution) of the illumination. A projection optics model 32 represents optical characteristics (including changes to the radiation intensity distribution and/or the phase distribution caused by the projection optics) of the projection optics. A design layout model 33 represents optical characteristics (including changes to the radiation intensity distribution and/or the phase distribution caused by a given design layout) of a design layout, which is the representation of an arrangement of features on or formed by a patterning device. An aerial image 34 can be simulated from the source model 31, the projection optics model 32 and the design layout model 33. A resist image 36 can be simulated from the aerial image 34 using a resist model 35. An etch image 38 can be simulated from the resist image 36 using an etch model 37. The aerial image 34, the resist image 36 or the etch image 38 may be used to determine a characteristic (e.g., the existence, location, type, shape, etc. of) of a pattern.

More specifically, it is noted that the source model 31 can represent the optical characteristics of the illumination that include, but are not limited to, a sigma ($\sigma$) setting as well as any particular illumination shape (e.g. off-axis radiation illumination shapes such as annular, quadrupole, dipole, etc.). The projection optics model 32 can represent the optical characteristics of the projection optics that can include aberration, distortion, refractive index, physical size, physical dimension, etc. The design layout model 33 can represent physical properties of a design layout and/or a physical patterning device for the design layout, as described, for example, in U.S. Pat. No. 7,587,704, which is incorporated by reference in its entirety.

The objective of the simulation is to accurately predict, for example, edge placements, aerial image intensity slopes, CDs, etc., which can then be compared against an intended design. The intended design is generally defined as a pre-OPC design layout which can be provided in a standardized digital file format such as GDSII or OASIS or other file format.

The model used at 213 of FIG. 2 may be a probabilistic model, i.e., a model that computes a probability of the characteristic of defects having a certain value. For example, the model may predict the probability that a pattern in an image has a certain shape or a certain CD. A probabilistic model may better capture random variations in the device manufacturing process than a non-probabilistic model. Random variations may be due to a variety of mechanisms such as photon shot noise, thermal noise, mechanical vibration, etc.

Figure 4A:
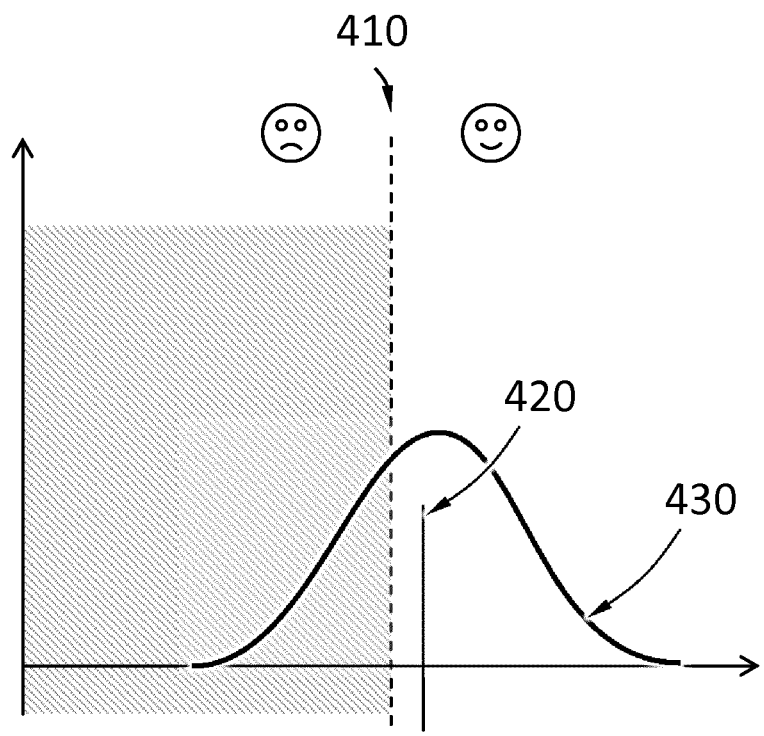
FIGS. 4A, 4B, 4C and 4D schematically show that a probabilistic model can better account for random variations and thus, for example, better guide inspection of a substrate produced in the device manufacturing process, than a non-probabilistic model.
Figure 4B:
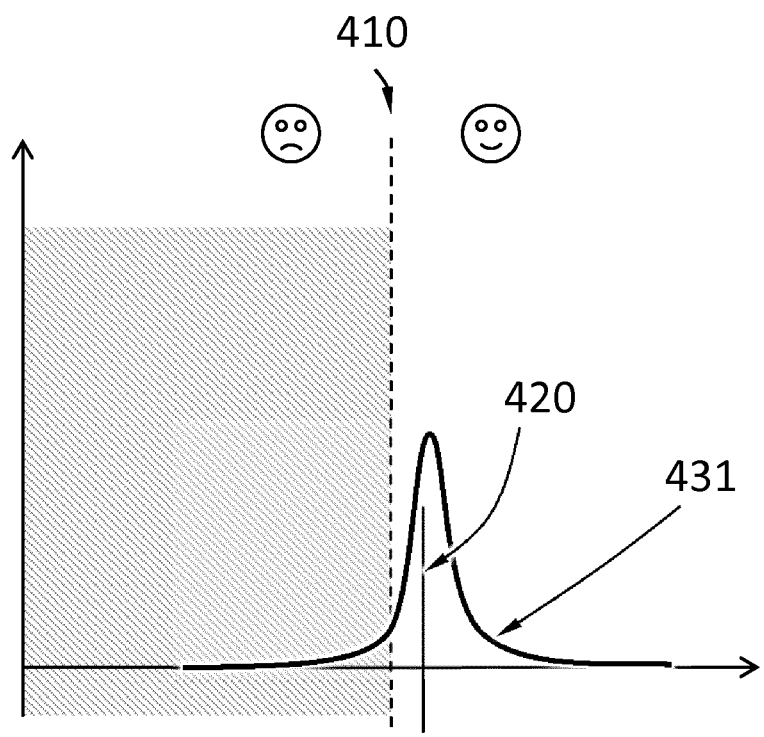

FIGS. 4A, 4B, 4C and 4D schematically show that a probabilistic model can better account for random variations and thus, for example, better guide inspection of a substrate produced in the device manufacturing process, than a non-probabilistic model. FIG. 4A and FIG. 4B each show that a non-probabilistic model computes a value 420 of a characteristic of a pattern on a substrate produced by the device manufacturing process. A non-exhaustive list of examples of the characteristic may include one or more selected from: position relative to the substrate, position relative to one or more other patterns on the substrate, a geometric size (e.g., a CD), a geometric shape, and/or a measure of a stochastic effect (e.g., CD uniformity (CDU), line width roughness (LWR), etc.). If the characteristic fails to satisfy a condition (here, for example, if the characteristic is smaller than a threshold 410), the pattern is a defect; if the characteristic satisfies the condition (here, for example, if the characteristic is larger than the threshold 410), the pattern is not a defect. The value 420 is larger than the threshold 410 in the examples shown in FIG. 4A and FIG. 4B. Therefore, based on the non-probabilistic model, this pattern should not be considered a defect.

However, the non-probabilistic model, like any model, may not be perfectly accurate. The computed value of a characteristic by the non-probabilistic model and the actual value of the characteristic may have a difference. This difference is called the residue. The residue may be attributed to random variations, imperfection of the non-probabilistic model, the input of the non-probabilistic model, or a combination thereof. In the examples of FIG. 4A and FIG. 4B, if the residue is large enough (e.g., larger than the difference between the value 420 and the threshold 410), the actual value of the characteristic may be smaller than the threshold 410 and the pattern is a defect. The residue may have a distribution (e.g., distribution 430 in FIG. 4A and distribution 431 in FIG. 4B). The distribution 430 of the residue in the example of FIG. 4A is wider than the distribution 431 of the residue in the example of FIG. 4B. The residue in the example of FIG. 4A thus has a larger probability than in the example of FIG. 4B to be larger than the difference between the value 420 and the threshold 410. In other words, the actual value of the characteristic in the example of FIG. 4A has a larger probability than in the example of FIG. 4B to be smaller than the threshold 410; the pattern in the example of FIG. 4A has a larger probability than in the example of FIG. 4B to be a defect. The non-probabilistic model cannot capture the distribution (e.g., distributions 430 and 431) of the residue and thus fails to capture some defects (or many defects in the example of FIG. 4A).

Figure 4C:
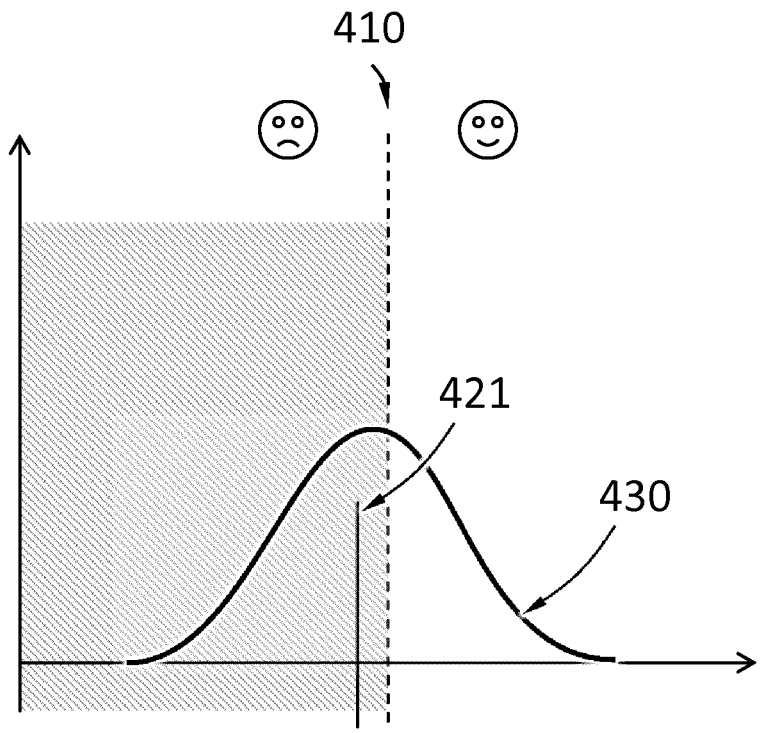
Figure 4D:
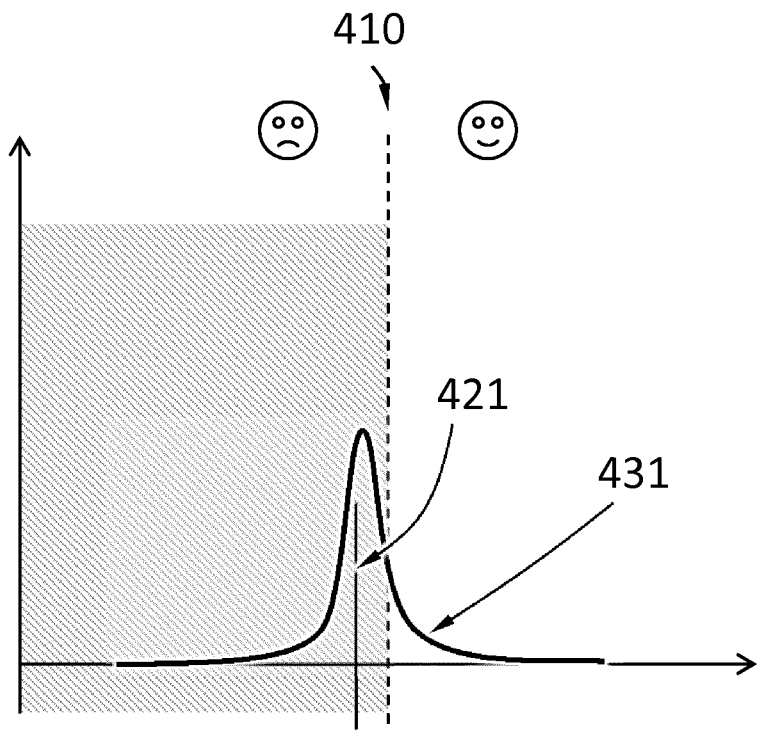

Similarly, the non-probabilistic model may predict a non-defect as a defect. FIG. 4C and FIG. 4D each show that a non-probabilistic model computes a value 421 of the characteristic of another pattern on the substrate. If the characteristic fails to satisfy a condition (here, for example, if the characteristic is smaller than a threshold 410), the pattern is a defect; if the characteristic satisfies the condition (here, for example, if the characteristic is larger than the threshold 410), the pattern is not a defect. The value 421 is smaller than the threshold 410 as shown in FIG. 4C and FIG. 4D. Therefore, based on the non-probabilistic model, this other pattern should be considered a defect. However, in the examples of FIG. 4C and FIG. 4D, if the residue is large enough (e.g., larger than the difference between the value 421 and the threshold 410), the actual value of the characteristic may be larger than the threshold 410 and the other pattern is not a defect. The distribution 430 of the residue in the example of FIG. 4C is wider than the distribution 431 of the residue in the example of FIG. 4D. The residue in the example of FIG. 4C thus has a larger probability than in the example of FIG. 4D to be larger than the difference between the value 421 and the threshold 410. In other words, the actual value of the characteristic in the example of FIG. 4C has a larger probability than in the example of FIG. 4D to be larger than the threshold 410; the pattern in the example of FIG. 4C has a larger probability than in the example of FIG. 4D not to be a defect. The non-probabilistic model cannot capture the distribution (e.g., distributions 430 and 431) of the residue and thus predicts some non-defects (or many non-defects in the example of FIG. 4C) as defects.

Figure 5:
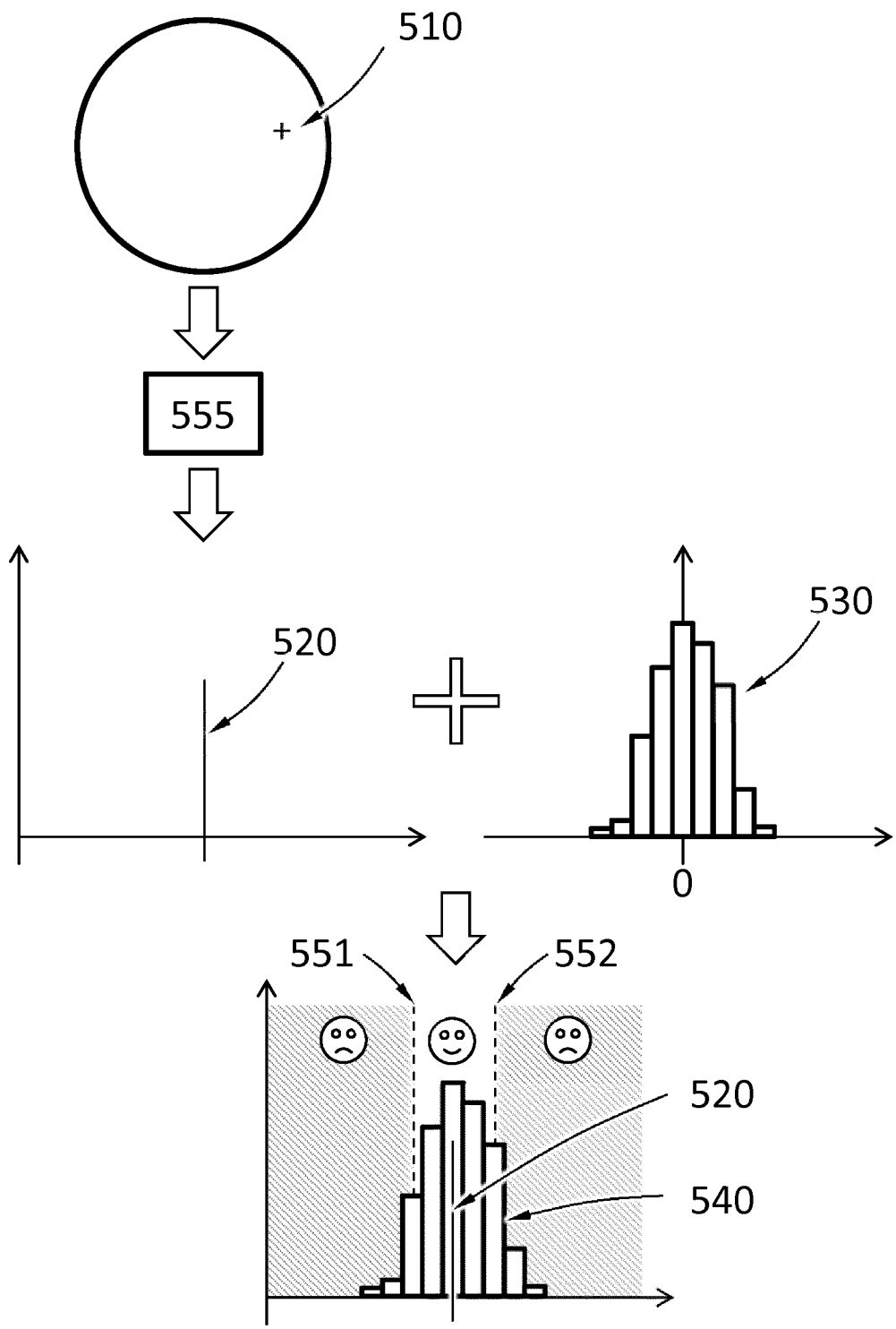
FIG. 5 schematically shows how a probabilistic model is used to predict defects, according to an embodiment.

FIG. 5 schematically shows how a probabilistic model is used to predict defects, according to an embodiment. A non-probabilistic model 555 is used to compute a value 520 of a characteristic of a pattern 510 on a substrate produced by the device manufacturing process. A non-exhaustive list of examples of the characteristic may include one or more selected from: position relative to the substrate, position relative to one or more other patterns on the substrate, a geometric size (e.g., a CD), a geometric shape, and/or a measure of a stochastic effect (e.g., CD uniformity (CDU), line width roughness (LWR), etc.). The non-probabilistic model 555 may compute the value 520 based on one or more process parameters or layout parameters, or empirically. A distribution 530 of residues of the non-probabilistic model 555 is added to the value 520, thereby producing a distribution 540 of the characteristic. The distribution 540 may be used to compute the probability that the pattern 510 is a defect (e.g., the probability that the characteristic falls beyond a range between threshold values 551 and 552).

Figure 6:
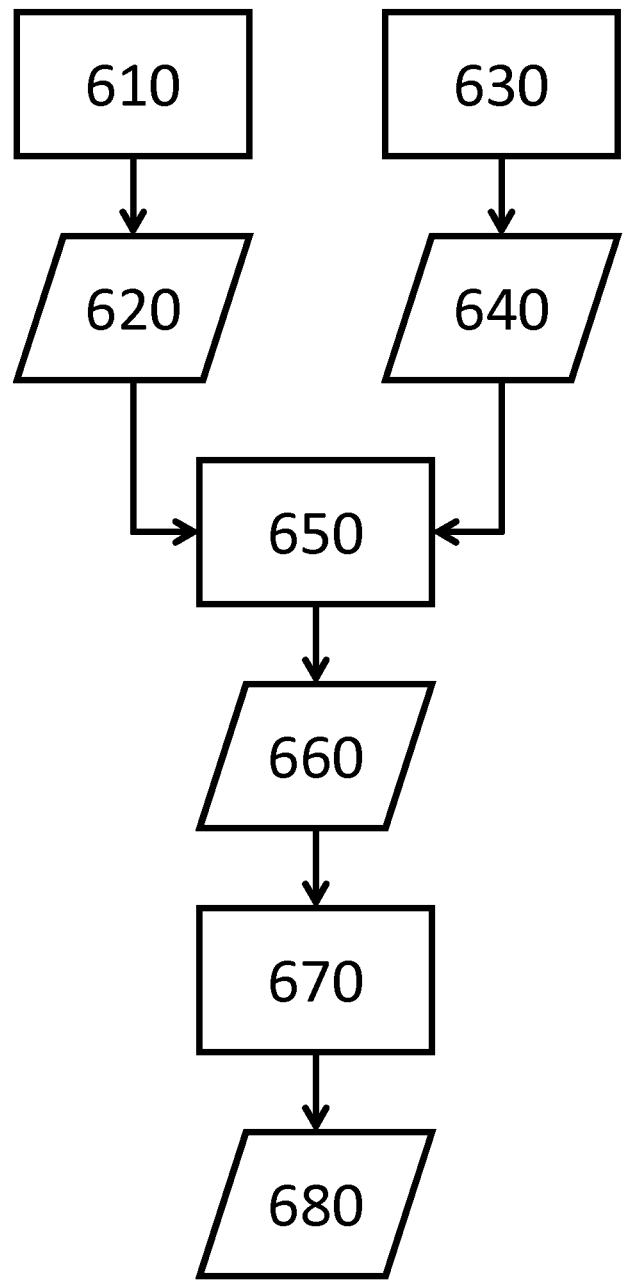
FIG. 6 shows a flowchart for a method of computing a probability of defects on a substrate produced by a device manufacturing process, according to an embodiment.

FIG. 6 shows a flowchart for a method of computing a probability of defects on a substrate produced by the device manufacturing process, according to an embodiment. At 610, an attribute 620 of a distribution of the residue of a non-probabilistic model is obtained. One example of the attribute 620 is a probability density function (PDF) of the residue. Another example of the attribute 620 is a cumulative distribution function (CDF) of the residue. The attribute 620 may be one that represents the spread of the distribution (e.g., variance and standard deviation). At 630, a value 640 of a characteristic of a pattern on the substrate is computed using the non-probabilistic model. A non-exhaustive list of examples of the characteristic may include one or more selected from: position relative to the substrate, position relative to one or more other patterns on the substrate, a geometric size (e.g., a CD), a geometric shape, and/or a measure of a stochastic effect (e.g., CD uniformity (CDU), line width roughness (LWR), etc.). At 650, an attribute 660 of the distribution of the characteristic is determined based on the attribute 620 of the distribution of the residue and on the value 640 computed using the non-probabilistic model. In an example, the attribute 660 is a sum of the value 640 computed using the non-probabilistic model and the attribute 620 of the distribution of the residue. At 670, a probability 680 that the pattern is a defect is determined based on the attribute 660. In an example, the attribute 660 is a PDF of the characteristic and the probability 680 may be the integration of the PDF over a range of the characteristic (e.g., a range below a threshold or a range above a threshold). In an example, the attribute 660 is a CDF of the characteristic and the probability 680 may be the difference between the CDF at the upper bound of a range of the characteristic and the CDF at the lower bound of the range. The attribute 660 may be normalized, for example, by requiring the expected value of the total number of defects on the substrate to equal the sum of the probability that each pattern on the substrate is a defect.

Figure 7:
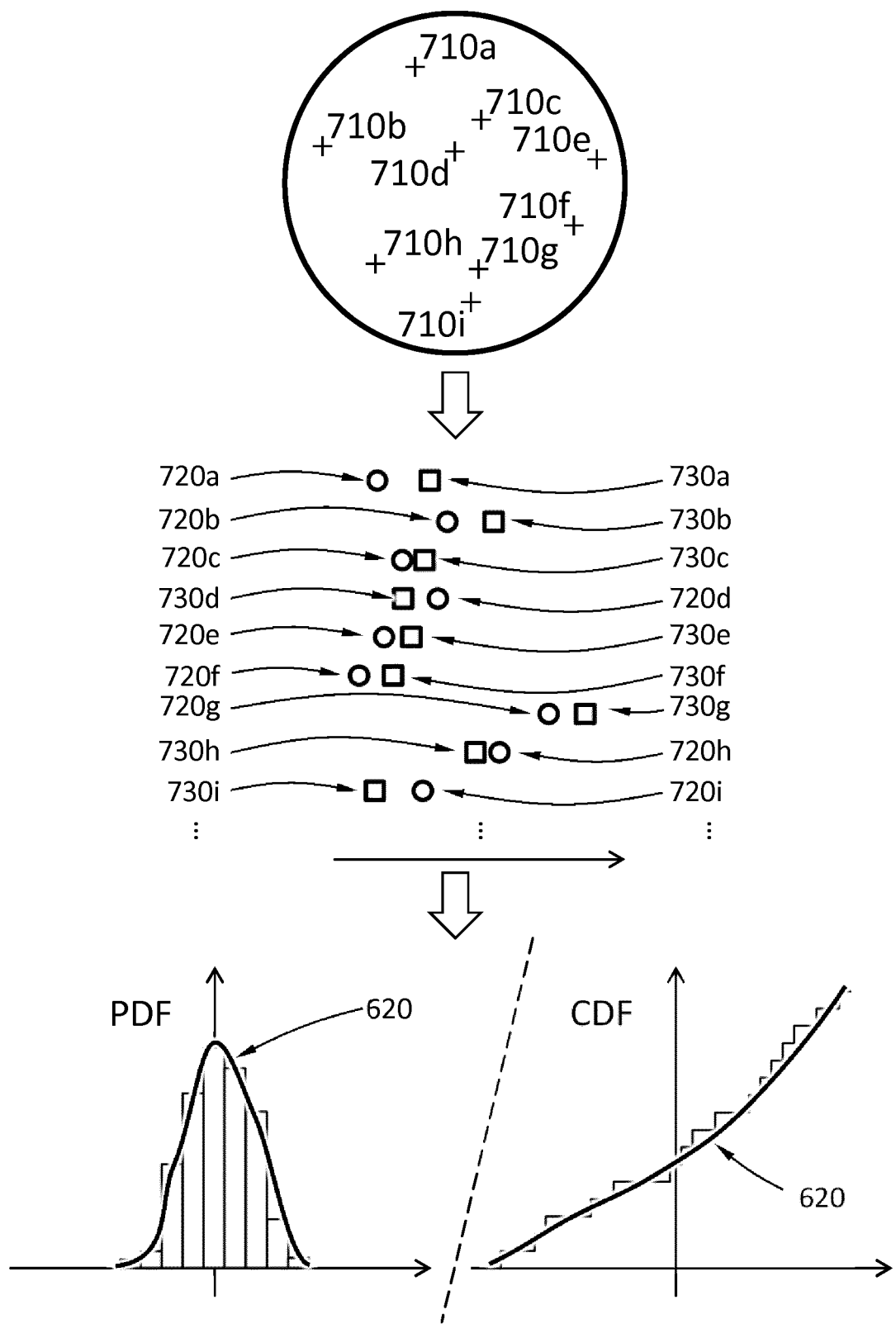
FIG. 7 schematically shows how an attribute of the distribution of the residue of the non-probabilistic model may be obtained (e.g., as in step 610 of FIG. 6), according to an embodiment.

FIG. 7 schematically shows how the attribute 620 of the distribution of the residue of the non-probabilistic model may be obtained (e.g., as in step 610 of FIG. 6), according to an embodiment. A plurality of patterns (e.g., 710*a*, 710b, ... 710i, ...) on a substrate produced by the device manufacturing process are selected. The plurality of patterns may be selected using one or more criteria. For example, the plurality of patterns may be those having similar shape, similar size, similar function, or in spatial proximity. Computed values (e.g., 730a, 730b, ... 730i, ...) of a characteristic of these patterns are obtained using the non-probabilistic model. A non-exhaustive list of examples of the characteristic may include one or more selected from: position relative to the substrate, position relative to one or more other patterns on the substrate, a geometric size (e.g., a CD), a geometric shape, and/or a measure of a stochastic effect (e.g., CD uniformity (CDU), line width roughness (LWR), etc.). Verified values (e.g., 720a, 720b, ... 720i, ...) of the characteristic of these patterns may be actual values of the characteristic obtained by measuring the patterns, for example, using a suitable metrology tool or simulated values of the characteristic using a vigorous model. Examples of the metrology tool may include an optical metrology tool that measures an optical image, diffraction, scattering, or other suitable optical signal from the substrate, and/or a metrology tool using a beam of charged particles (e.g., electrons). Values of the residue of the non-probabilistic model are obtained from the differences between the verified value and the computed value of each of these patterns.

The attribute 620 of the distribution of the residue is obtained from the values of the residue. In one example, the attribute 620 is a PDF of the residue, which may be determined from a histogram of the residue. In another example, the attribute 620 is a CDF of the residue. The CDF may be estimated based on an empirical distribution function (EDF), which is also called an empirical cumulative distribution function (ECDF). The EDF may be determined from the values of the residue. An EDF is the distribution function associated with the empirical measure of a sample (e.g., the values of the residue obtained from the plurality of patterns). The EDF is a step function that steps up by 1/n at each of the n data points (e.g., the values of the residue obtained from the plurality of patterns). The EDF may be written in the following formula:

$$\hat{F}(t) = \frac{1}{n}\sum_{i=1}^{n} 1_{x_i \leq t},$$

where $(x_1, \ldots, x_n)$ are the values in the sample, and $1_A$ is the indicator of event A. The value of the EDF $\hat{F}(t)$ at any specified value t is the fraction of the sample that is less than or equal to t. It converges with probability 1 to that underlying distribution with increasing n, according to the Glivenko-Cantelli theorem. The CDF may be estimated based on the EDF $\hat{F}(t)$ using the Dvoresztky-Kiefer-Wolfowitz (DKW) inequality. The CDF $\hat{F}(t)$ may be estimated based on the EDF $\hat{F}(t)$ using the Dvoresztky-Kiefer-Wolfowitz (DKW) inequality. The estimation error E of the CDF based on the EDF is bounded by the DKW inequality:

$$\mathbb{P}\left\{\sup_t |F(t) - \hat{F}(t)| > \epsilon\right\} \leq 2e^{-2n\epsilon^2}.$$

The DKW inequality shows that the estimation error E may be determined by the number of the values of the residue n used to construct the EDF $\hat{F}(t)$.

Figure 8:
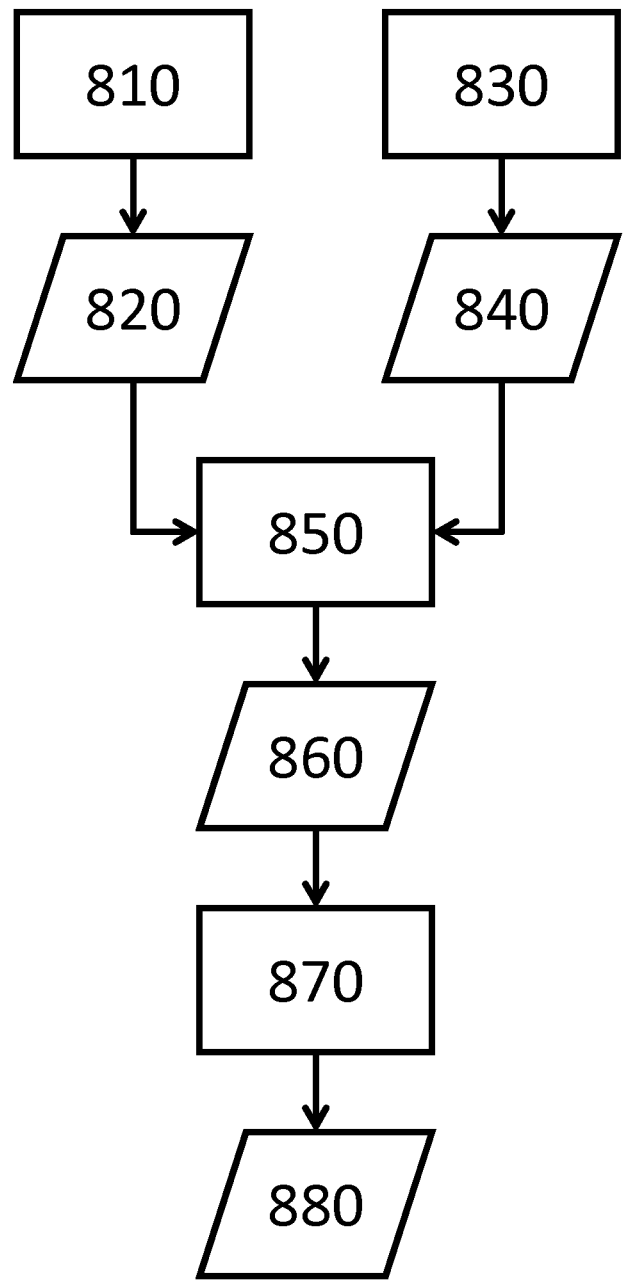
FIG. 8 shows a flowchart for a method (e.g., step 610 in FIG. 6) of obtaining an attribute (e.g., the attribute 620 in FIG. 7) of a distribution of the residue of a non-probabilistic model, according to an embodiment.
Figure 9A:
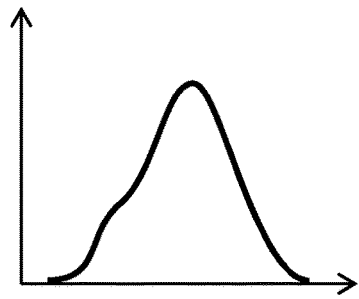
FIGS. 9A, 9B, 9C, 9D, 9E, 9F and 9G each show a histogram of the residue as an example of the attribute of the distribution of the residue.
Figure 9B:
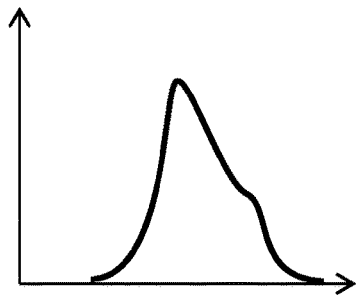
Figure 9C:
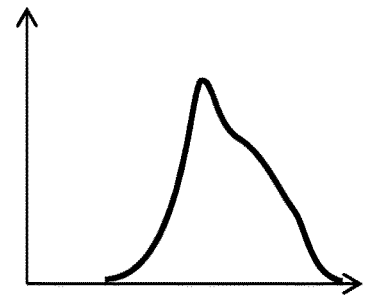
Figure 9D:
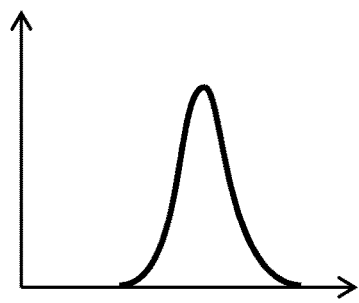
Figure 9E:
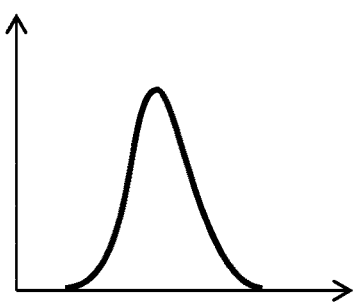
Figure 9F:
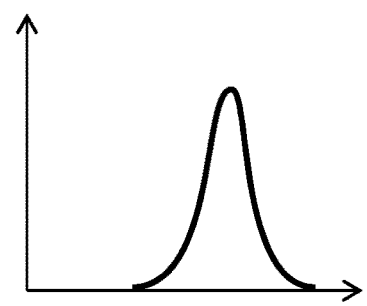
Figure 9G:
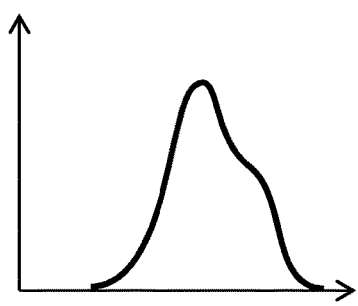

FIG. 8 shows a flowchart for a method (e.g., step 610 in FIG. 6) of obtaining an attribute 880 (e.g., the attribute 620 in FIGS. 6 and 7) of a distribution of the residue of a non-probabilistic model, according to an embodiment. At 810, verified values 820 of a characteristic of a plurality of patterns on a substrate are obtained, for example, by measuring the patterns using a metrology tool or by simulation using a vigorous model. At 830, computed values 840 of the characteristic are obtained using a non-probabilistic model for the patterns. At 850, values 860 of the residue of the non-probabilistic model are obtained based on the verified values 820 and the computed values 840. In an example, the values 860 of the residues are the differences between the computed values 840 and the verified values 820. At 870, the attribute 880 (e.g., the PDF or CDF) of the distribution of the residue is obtained based on the values 860 of the residue.

FIGS. 9A, 9B, 9C, 9D, 9E, 9F and 9G each show a histogram of the residue as an example of the attribute 880. The horizontal axis is the values of the residue and the vertical axis is the frequency of the values. The histograms shown in FIGS. 9A-9G are respectively obtained from seven groups of patterns with different nominal CDs.

Figure 10:
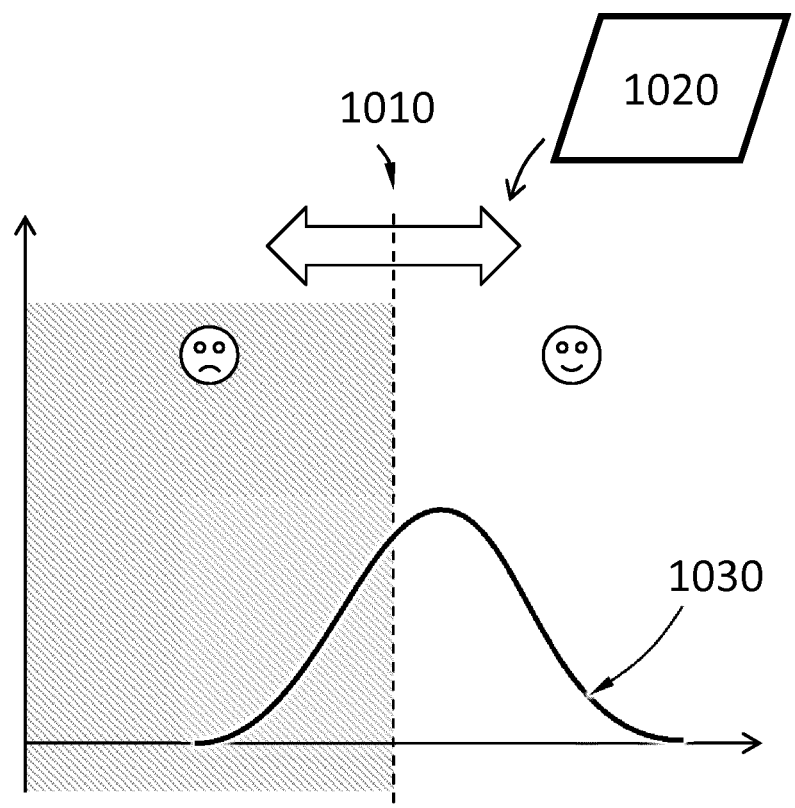
FIG. 10 schematically shows an example, where the probability that a pattern is a defect is the integration of a PDF over a range from minus infinity to a threshold value.

The attribute (e.g., 660 in FIG. 6) of the distribution of the characteristic is one factor in the determination of the probability that a pattern is a defect but is not necessarily the only factor. The range of the characteristic in which the pattern is considered a defect may be another factor. Other factors are also possible. In an example schematically shown in FIG. 10, the probability that a pattern is a defect is the integration of a PDF 1030 of a CD (as an example of the attribute of the distribution of the characteristic) over a range from minus infinity to a threshold value 1010. Practical considerations 1020 may affect the choice of the threshold value 1010. For example, if the total number of inspections or the amount of time available for inspection is limited, the threshold value 1010 may be made smaller, thereby reducing the number of patterns considered defects. The threshold value 1010 may be normalized using data from a test substrate. For example, the threshold value 1010 may be chosen such that the total probability of defects is comparable to (e.g., within an order of magnitude from) the actual number of defects on the test substrate.

Figure 11:
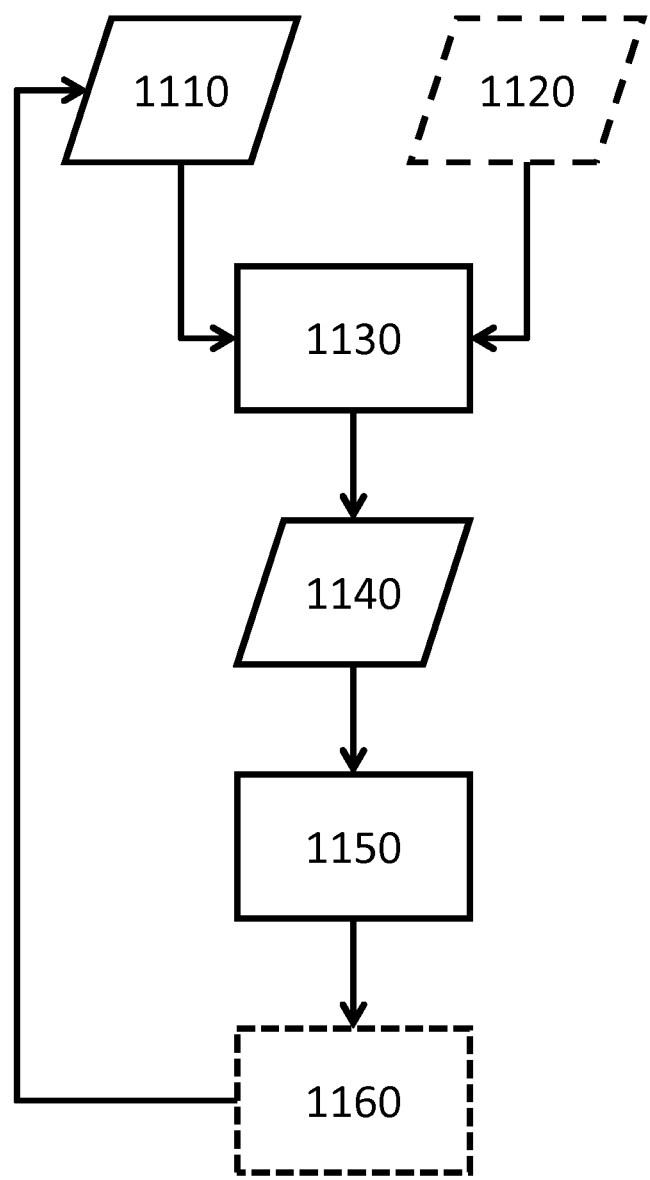
FIG. 11 schematically shows a flowchart for a method of using the probability that a pattern is a defect to determine which patterns on a substrate are to be inspected and the order in which these patterns are to be inspected, according to an embodiment.

The probability that the pattern is a defect may be used to guide inspection of a substrate produced by the device manufacturing process. A pattern with a higher probability of being a defect may be prioritized in the inspection over a pattern with a lower probability of being a defect. FIG. 11 schematically shows a flowchart for a method of using the probability that a pattern is a defect to determine which patterns on a substrate are to be inspected and the order in which these patterns are to be inspected, according to an embodiment. The probabilities 1110 that a set of patterns on the substrate are respectively defects are obtained, e.g., using the method shown in FIG. 6. Locations 1120 of the patterns may also be obtained, e.g., using the design layout represented on the substrate. At 1130, an ordered list 1140 of patterns to be inspected is determined based on the probabilities 1110, and optionally based on the locations 1120. At 1150, the patterns in the ordered list 1140 are inspected following the order of the ordered list. In an example, the ordered list 1140 includes those patterns with the highest probabilities of being defects; in other words, the ordered list 1140 comprises a subset of patterns among the set of patterns, where the patterns in the subset have higher probabilities of being defects than the patterns in the set but not in the subset. The number of patterns in the ordered list 1140 may be determined by the inspection throughput or may be empirically determined. The number of patterns in the ordered list 1140 may be limited by the amount of time before the next substrate for inspection arrives. The number of patterns in the ordered list 1140 may be limited by the amount of radiation the substrate is allowed to receive during the inspection. In an example, the order of the patterns in the ordered list 1140 may be a descending order of the probabilities. In other words, the order may be that a pattern with higher probability of being a defect is inspected before a pattern with lower probability of being a defect ("the order of descending probabilities"). In another example, the order of the patterns in the ordered list 1140 may be an order that causes a cost function to be at an extremum. In an embodiment, the cost function is a function of the order of the patterns and may represent the probabilities, the amounts of time needed for inspecting the patterns, the distance from one pattern to the next pattern, and/or other indicators of the performance of the inspection. In optional step 1160, the probabilities 1110 are updated based on data obtained from inspecting the patterns in the ordered list 1140.

Figure 12A:
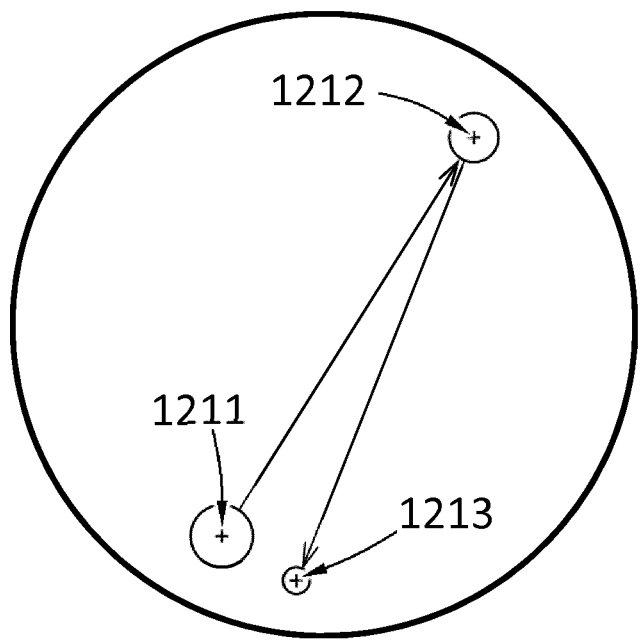
FIG. 12A and FIG. 12B schematically show that the order of descending probabilities may be inferior in terms of the inspection throughput compared to another order.
Figure 12B:
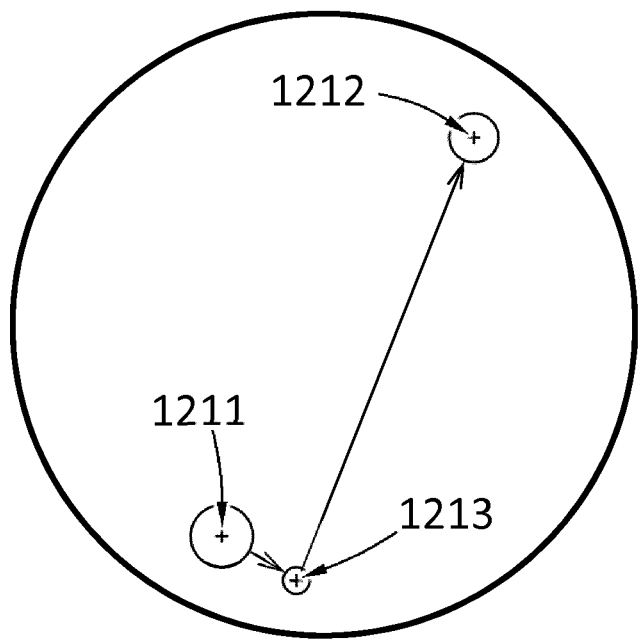

FIG. 12A and FIG. 12B schematically show that the order of descending probabilities may be inferior in terms of the inspection throughput compared to another order. In the example in FIG. 12A and FIG. 12B, there are three patterns 1211, 1212 and 1213 on the substrate. The pattern 1211 has the largest probability (as represented by the size of the circle) of being a defect. The pattern 1212 has the second largest probability of being a defect, which is slightly smaller than the probability of the pattern 1211. The pattern 1213 has the smallest probability of being a defect, which is much smaller than the probability of the pattern 1211 and the probability of the pattern 1212. The patterns 1212 are far away from the patterns 1211 and 1213; the patterns 1211 and 1213 are close to each other. FIG. 12A shows an order of the ordered list of pattern 1211→pattern 1212→pattern 1213, which is the order of descending probabilities. FIG. 12B shows a different order of the ordered list of pattern 1211→pattern 1213→pattern 1212, which is not the order of descending probabilities. By following the order in FIG. 12A, the metrology tool has to travel relatively long distances from pattern 1211 to pattern 1212 and from pattern 1212 to pattern 1213. By following the order in FIG. 12B, the metrology tool has to travel one relatively short distance from pattern 1211 to pattern 1213 and one relatively long distance from pattern 1213 to pattern 1212. Therefore, the total time needed for inspecting the three patterns is shorter (and thus the inspection throughput higher) by following the order in FIG. 12B.

Figure 13A:
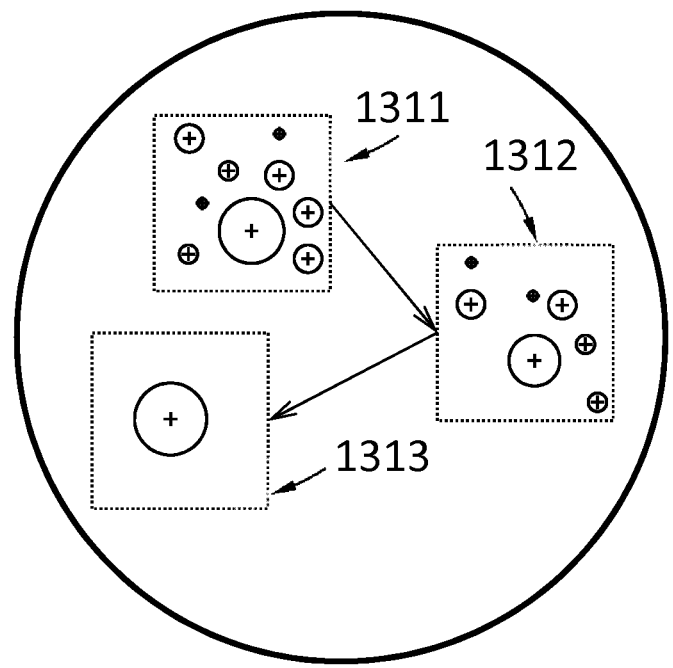
FIG. 13A and FIG. 13B schematically show that the order of descending probabilities may be inferior in terms of the inspection throughput compared to another order.
Figure 13B:
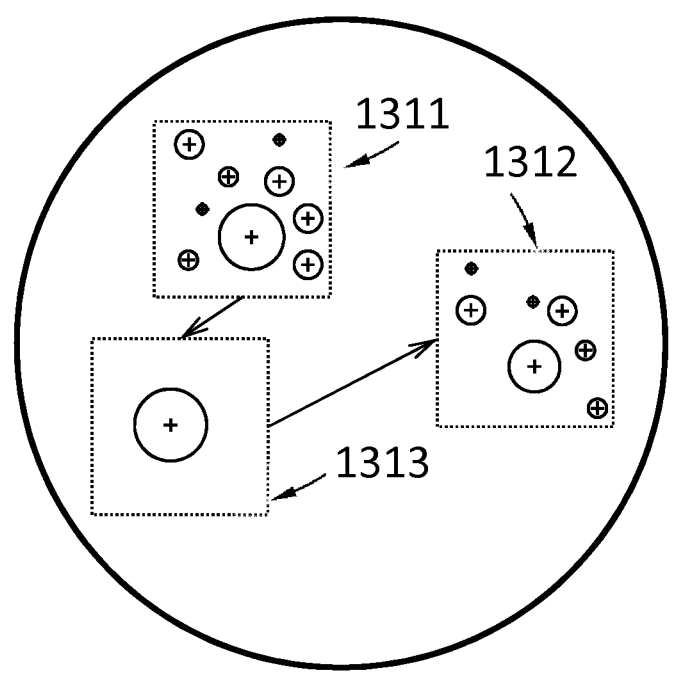

A metrology tool may have the capability of inspecting multiple patterns without moving the field of view ("FOV"). For example, some metrology tools using beams of charged particles have a FOV that may encompass multiple patterns, but moving the FOV is relatively slow. The multiple patterns inspected before the metrology tool is moved can be considered inspected in one shot. FIG. 13A and FIG. 13B schematically show that the order of descending probabilities may be inferior in terms of inspection throughput than another order, when such a metrology tool is used for inspection. In the example shown in FIG. 13A and FIG. 13B, there are seventeen patterns on the substrate and these patterns may be encompassed by three FOVs 1311, 1312 and 1313. The patterns are represented by the + signs and the circles represent the probability of the pattern being defective with the larger the circle, the greater the probability. Because moving the FOV is relatively slow, inspecting the patterns using more than three FOVs would reduce the inspection throughput. The total probability of defects within the FOV 1311 (i.e., the sum of the probability for each of the patterns in the FOV 1311 to be a defect) is the largest among the three FOVs. The total probability of defects within the FOV 1313 is the smallest, although the FOV 1313 has a pattern that is most probable to be a defect among the seventeen patterns (as shown by its relatively large circle). The FOV 1312 is far away from the FOVs 1311 and 1313; the FOVs 1311 and 1313 are close to each other. FIG. 13A shows an order of the ordered list of patterns in FOV 1311→patterns in FOV 1312→patterns in FOV 1313. FIG. 13B shows a different order of the ordered list of patterns in FOV 1311→patterns in FOV 1313→patterns in FOV 1312. By following the order in FIG. 13A, the metrology tool has to move the FOV by relatively long distances from FOV 1311 to FOV 1312 and from FOV 1312 to FOV 1313. By following the order in FIG. 13B, the metrology tool has to travel one relatively short distance from FOV 1311 to FOV 1313 and one relatively long distance from FOV 1313 to FOV 1312. Therefore, the total time needed for inspecting the three patterns is shorter by following the order in FIG. 13B.

Figure 14:
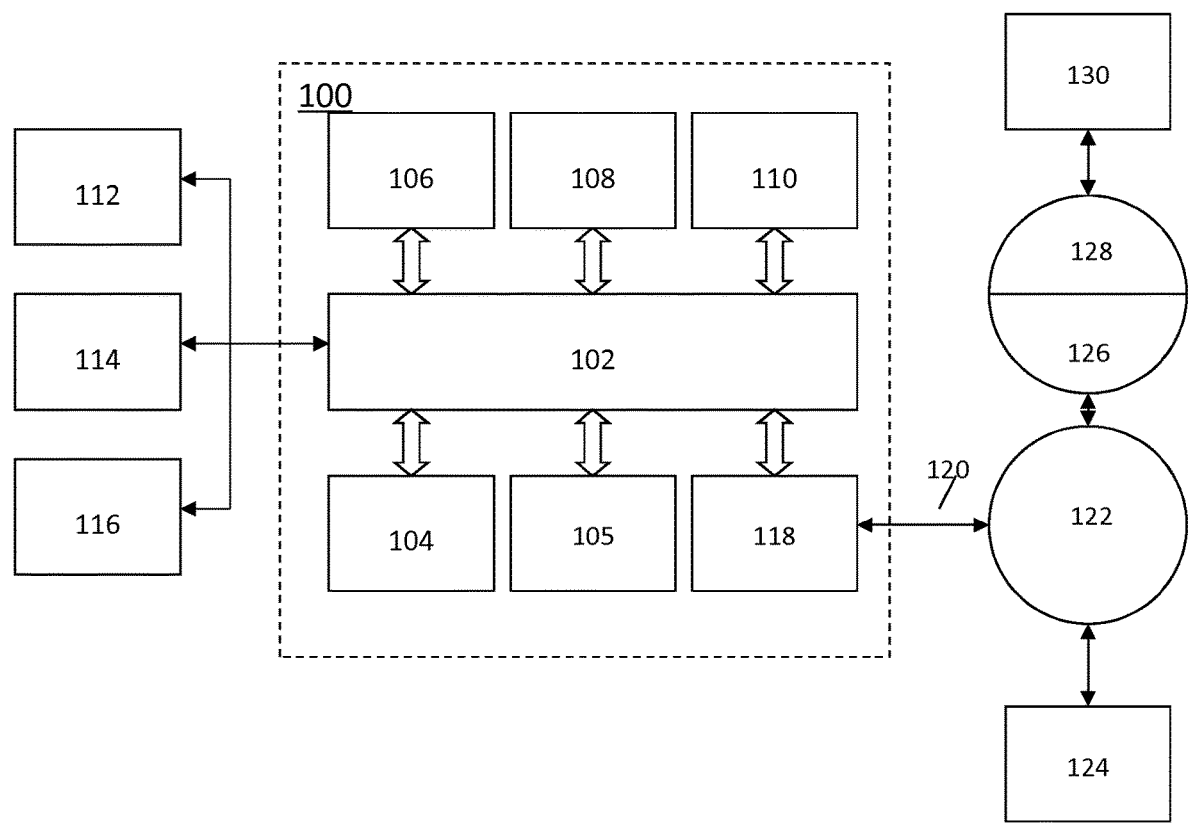
FIG. 14 is a block diagram of an example computer system.

FIG. 14 is a block diagram that illustrates a computer system 100 which can assist in implementing the methods and flows disclosed herein. Computer system 100 includes a bus 102 or other communication mechanism to communicate information, and a processor 104 (or multiple processors 104 and 105) coupled with bus 102 to process information. Computer system 100 may also include a main memory 106, such as a random access memory (RAM) or other dynamic storage device, coupled to bus 102 to store and/or supply information and instructions to be executed by processor 104. Main memory 106 may be used to store and/or supply temporary variables or other intermediate information during execution of instructions to be executed by processor 104. Computer system 100 may further include a read only memory (ROM) 108 or other static storage device coupled to bus 102 to store and/or supply static information and instructions for processor 104. A storage device 110, such as a magnetic disk or optical disk, may be provided and coupled to bus 102 to store and/or supply information and instructions.

Computer system 100 may be coupled via bus 102 to a display 112, such as a cathode ray tube (CRT) or flat panel or touch panel display, to display information to a computer user. An input device 114, including alphanumeric and other keys, may be coupled to bus 102 to communicate information and command selections to processor 104. Another type of user input device may be cursor control 116, such as a mouse, a trackball, or cursor direction keys, to communicate direction information and command selections to processor 104 and to control cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the methods disclosed herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may be employed to execute the sequences of instructions contained in main memory 106. In an alternative embodiment, hardwired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a disk or memory of a remote computer. The remote computer can load the instructions into its dynamic memory and send the instructions over a communications path. Computer system 100 can receive the data from the path and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may include a communication interface 118 coupled to bus 102. Communication interface 118 provides a two-way data communication coupling to a network link 120 that is connected to a network 122. For example, communication interface 118 may provide a wired or wireless data communication connection. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through network 122 to a host computer 124 or to data equipment operated by an Internet Service Provider (ISP) 126. ISP 126 in turn provides data communication services through the worldwide packet data communication network, now commonly referred to as the "Internet" 128. Network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, network 122 and communication interface 118. One such downloaded application may provide for the code to implement a method herein, for example. The received code may be executed by processor 104 as it is received, and/or stored in storage device 110, or other non-volatile storage for later execution. In this manner, computer system 100 may obtain application code in the form of a carrier wave.

Figure 15:
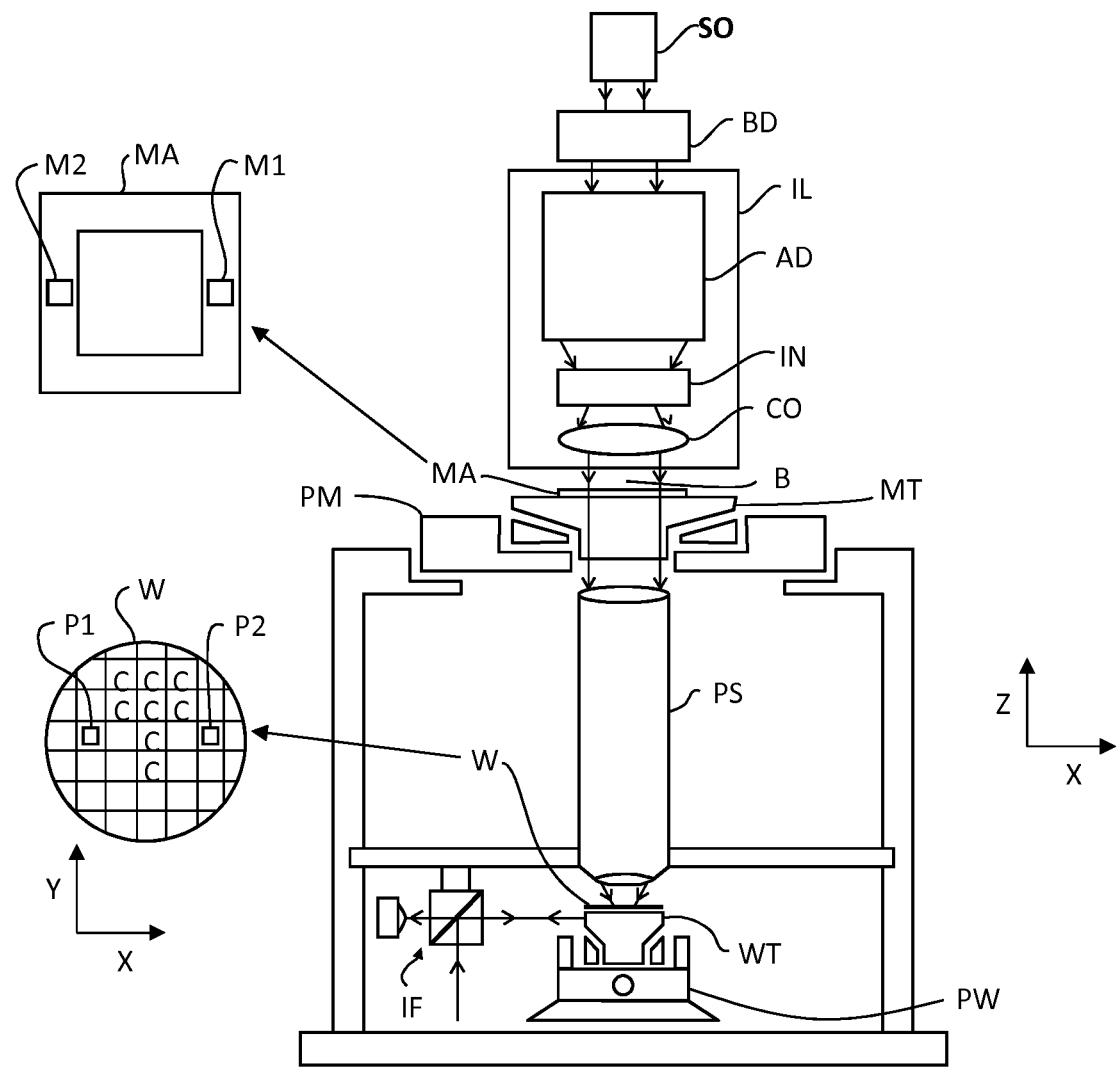
FIG. 15 is a schematic diagram of a lithographic apparatus.

FIG. 15 schematically depicts an exemplary lithographic apparatus. The apparatus comprises:

an illumination system IL, to condition a beam B of radiation. In this particular case, the illumination system also comprises a radiation source SO;

a first object table (e.g., mask table) MT provided with a patterning device holder to hold a patterning device MA (e.g., a reticle), and connected to a first positioner PM to accurately position the patterning device with respect to item PS;

a second object table (substrate table) WT provided with a substrate holder to hold a substrate W (e.g., a resist coated silicon wafer), and connected to a second positioner PW to accurately position the substrate with respect to item PS;

a projection system PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive mask).

However, in general, it may also be of a reflective type, for example (with a reflective mask). Alternatively, the apparatus may employ another kind of patterning device as an alternative to the use of a classic mask; examples include a programmable mirror array or LCD matrix.

The source SO (e.g., a mercury lamp or excimer laser) produces a beam of radiation. This beam is fed into an illumination system (illuminator) IL, either directly or after having traversed a conditioner, such as a beam expander. The illuminator IL may comprise an adjuster AD configured to set the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross section.

It should be noted with regard to FIG. 15 that the source SO may be within the housing of the lithographic apparatus (as is often the case when the source SO is a mercury lamp, for example), but that it may also be remote from the lithographic apparatus, the radiation beam that it produces being led into the apparatus (e.g., with the aid of suitable directing mirrors BD); this latter scenario is often the case when the source SO is an excimer laser (e.g., based on KrF, ArF or $F_2$ lasing).

The beam B subsequently intercepts the patterning device MA, which is held on a patterning device table MT. Having traversed the patterning device MA, the beam B passes through the projection system PS, which focuses the beam B onto a target portion C of the substrate W. With the aid of the second positioner PW (and interferometer IF), the substrate table WT can be moved accurately, e.g. so as to position different target portions C in the path of the beam B. Similarly, the first positioner PM can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 15.

Patterning device (e.g., mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies. Small alignment markers may also be included within dies, in amongst the device features, in which case it is desirable that the markers be as small as possible and not require any different imaging or process conditions than adjacent features.

Figure 16:
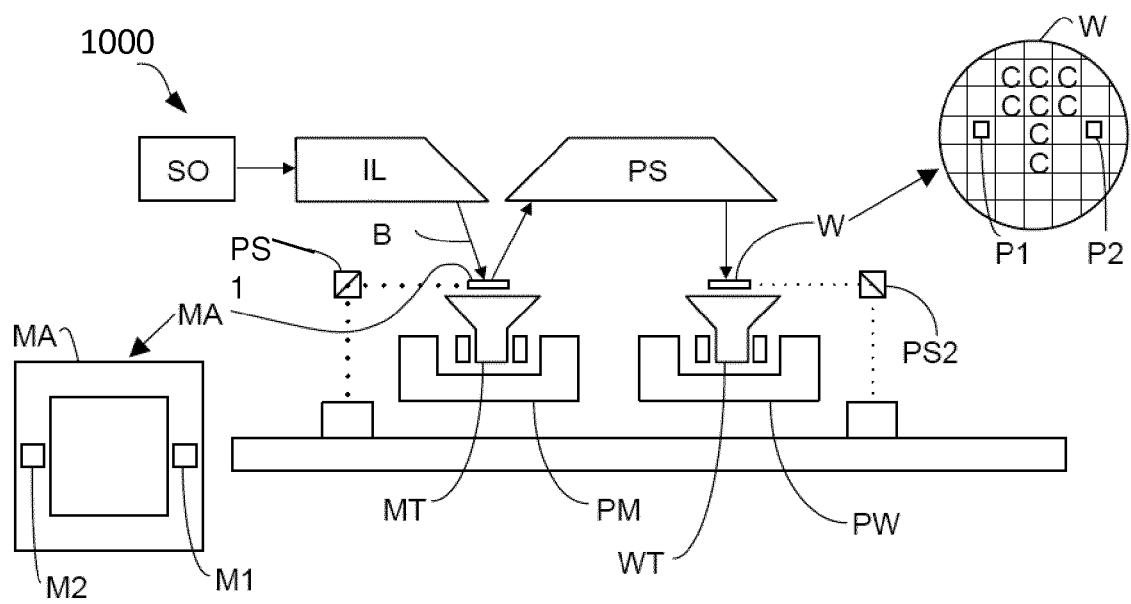
FIG. 16 is a schematic diagram of another lithographic apparatus.

FIG. 16 schematically depicts another exemplary lithographic apparatus 1000. The lithographic apparatus 1000 includes:
 a source collector module SO
 an illumination system (illuminator) IL configured to condition a radiation beam B (e.g. EUV radiation).
 a support structure (e.g. a mask table) MT constructed to support a patterning device (e.g. a mask or a reticle) MA and connected to a first positioner PM configured to accurately position the patterning device;
 a substrate table (e.g. a wafer table) WT constructed to hold a substrate (e.g. a resist coated wafer) W and connected to a second positioner PW configured to accurately position the substrate; and
 a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the patterning device may have a multi-layer reflector comprising, for example, a multi-stack of molybdenum and silicon. In one example, the multi-stack reflector has a 40 layer pairs of molybdenum and silicon. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 16, the illuminator IL receives an extreme ultra violet (EUV) radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 16, to provide the laser beam to excite the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously in a given direction (the so-called "scan direction") while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Further, the lithographic apparatus may be of a type having two or more tables (e.g., two or more substrate table, two or more patterning device tables, and/or a substrate table and a table without a substrate). In such "multiple stage" devices the additional tables may be used in parallel, or preparatory steps may be carried out on one or more tables while one or more other tables are being used for exposures.

Figure 17:
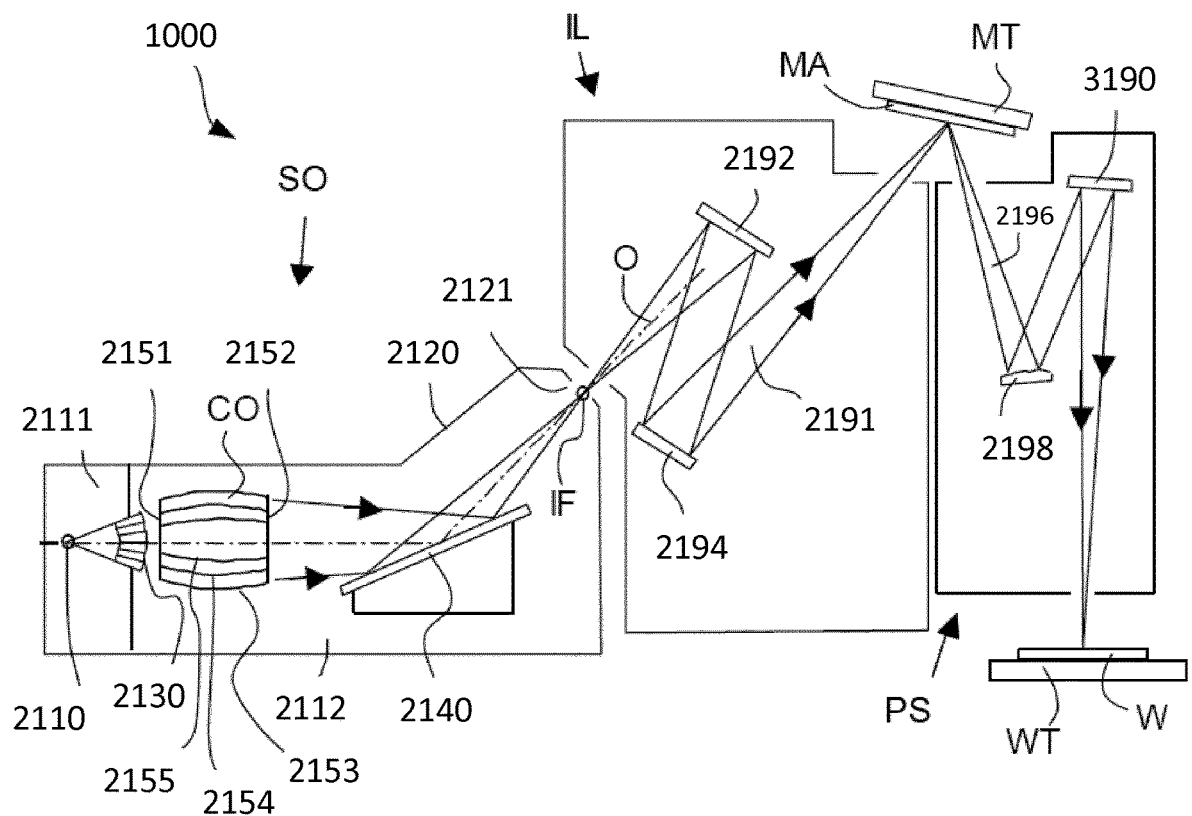
FIG. 17 is a more detailed view of the apparatus in FIG. 16.

FIG. 17 shows the apparatus 1000 in more detail, including the source collector module SO, the illumination system IL, and the projection system PS. The source collector module SO is constructed and arranged such that a vacuum environment can be maintained in an enclosing structure 2120 of the source collector module SO. An EUV radiation emitting plasma 2110 may be formed by a discharge produced plasma source. EUV radiation may be produced by a gas or vapor, for example Xe gas, Li vapor or Sn vapor in which the very hot plasma 2110 is created to emit radiation in the EUV range of the electromagnetic spectrum. The very hot plasma 2110 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 2110 is passed from a source chamber 2111 into a collector chamber 2112 via an optional gas barrier or contaminant trap 2130 (in some cases also referred to as contaminant barrier or foil trap) which is positioned in or behind an opening in source chamber 2111. The contaminant trap 2130 may include a channel structure. Contamination trap 2130 may also include a gas barrier or a combination of a gas barrier and a channel structure. The contaminant trap or contaminant trap 2130 further indicated herein at least includes a channel structure, as known in the art.

The source chamber 2111 may include a radiation collector CO which may be a so-called grazing incidence collector. Radiation collector CO has an upstream radiation collector side 2151 and a downstream radiation collector side 2152. Radiation that traverses collector CO can be reflected off a grating spectral filter 2140 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 2121 in the enclosing structure 2120. The virtual source point IF is an image of the radiation emitting plasma 2110.

Subsequently the radiation traverses the illumination system IL, which may include a facetted field mirror device 2192 and a facetted pupil mirror device 2194 arranged to provide a desired angular distribution of the radiation beam 2191, at the patterning device MA, as well as a desired uniformity of radiation intensity at the patterning device MA. Upon reflection of the radiation beam 2191 at the patterning device MA, held by the support structure MT, a patterned beam 2196 is formed and the patterned beam 2196 is imaged by the projection system PS via reflective elements 2198, 3190 onto a substrate W held by the substrate table WT.

More elements than shown may generally be present in illumination optics unit IL and projection system PS. The grating spectral filter 2140 may optionally be present, depending upon the type of lithographic apparatus. Further, there may be more mirrors present than those shown in the figures, for example there may be 1-6 additional reflective elements present in the projection system PS than shown in FIG. 17.

Collector optic CO, as illustrated in FIG. 17, is depicted as a nested collector with grazing incidence reflectors 2153, 2154 and 2155, just as an example of a collector (or collector mirror). The grazing incidence reflectors 2153, 2154 and 2155 are disposed axially symmetric around the optical axis O and a collector optic CO of this type is desirably used in combination with a discharge produced plasma source, often called a DPP source. Alternatively, the source collector module SO may be part of an LPP radiation system.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

The concepts disclosed herein may be used to simulate or mathematically model any device manufacturing process involving a lithographic apparatus, and may be especially useful with emerging imaging technologies capable of producing wavelengths of an increasingly smaller size. Emerging technologies already in use include deep ultraviolet (DUV) lithography that is capable of producing a 193 nm wavelength with the use of an ArF laser, and even a 157 nm wavelength with the use of a fluorine laser. Moreover, EUV lithography is capable of producing wavelengths within a range of 5-20 nm.

While the concepts disclosed herein may be used for device manufacturing on a substrate such as a silicon wafer, it shall be understood that the disclosed concepts may be used with any type of lithographic imaging systems, e.g., those used for imaging on substrates other than silicon wafers.

The patterning device referred to above comprises or can form a design layout. The design layout can be generated utilizing a CAD (computer-aided design) program. This process is often referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include: a programmable mirror array and a programmable LCD array.

As noted, microlithography is a significant step in the manufacturing of devices such as ICs, where patterns formed on substrates define functional elements of the ICs, such as microprocessors, memory chips etc. Similar lithographic techniques are also used in the formation of flat panel displays, micro-electro mechanical systems (MEMS) and other devices.

The process in which features with dimensions smaller than the classical resolution limit of a lithographic apparatus are printed, is commonly known as low-k1 lithography, according to the resolution formula CD=k1×λ/NA, where λ is the wavelength of radiation employed (currently in most cases 248 nm or 193 nm), NA is the numerical aperture of projection optics in the lithographic apparatus, CD is the "critical dimension"—generally the smallest feature size printed—and k1 is an empirical resolution factor. In general, the smaller k1 the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic apparatus and/or design layout. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "optimizing" and "optimization" as used herein mean adjusting an apparatus, e.g., lithographic apparatus, such that device fabrication results and/or processes (e.g., of lithography) have one or more desirable characteristics, such as higher accuracy of projection of a design layout on a substrate, larger process window, etc. As an example, OPC addresses the fact that the final size and placement of an image of the design layout projected on the substrate will not be identical to, or simply depend only on the size and placement of the design layout on the patterning device. A person skilled in the art will recognize that, especially in the context of lithography, the term "mask," "patterning device" and "design layout" can be used interchangeably. For the small feature sizes and high feature densities present on some design layout, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

To help ensure that the projected image of the design layout is in accordance with requirements of a given target circuit design, proximity effects may be predicted and compensated for, using sophisticated numerical models, corrections or pre-distortions of the design layout. Thus, "model-based" optical proximity correction processes can be used to alter the design layout. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

Applying OPC is generally not an "exact science", but an empirical, iterative process that does not always compensate for all possible proximity effect. Therefore, the effect of OPC, e.g., design layouts after application of OPC and any other RET, should be verified by design inspection, i.e. intensive full-chip simulation using calibrated numerical process models, in order to minimize the possibility of design flaws being built into the patterning device pattern. Both OPC and full-chip RET verification may be based on numerical modeling systems and methods.

One RET is related to adjustment of the global bias of the design layout. The global bias is the difference between the patterns in the design layout and the patterns intended to print on the substrate. For example, a circular pattern of 25 nm diameter may be printed on the substrate by a 50 nm diameter pattern in the design layout or by a 20 nm diameter pattern in the design layout but with high dose.

In addition to optimization to design layouts or patterning devices (e.g., OPC), the illumination source can also be optimized, either jointly with patterning device optimization or separately, in an effort to improve the overall lithography fidelity. The terms "illumination source" and "source" are used interchangeably in this document. As is known, off-axis illumination, such as annular, quadrupole, and dipole, is a proven way to resolve fine structures (i.e., target features) contained in the patterning device. However, when compared to a traditional illumination source, an off-axis illumination source usually provides less radiation intensity for the aerial image (AI). Thus, it becomes desirable to attempt to optimize the illumination source to achieve the optimal balance between finer resolution and reduced radiation intensity.

Numerous illumination source optimization approaches can be used. For example, the source can be partitioned into several regions, each of which corresponds to a certain region of the pupil spectrum. Then, the source distribution is assumed to be uniform in each source region and the brightness of each region is optimized for the process window. In another example, a method based on illuminator pixels can be used that converts the source optimization problem into a series of non-negative least square optimizations.

For low k1 photolithography, optimization of both the source and patterning device pattern is useful to ensure a viable process window for projection of critical circuit patterns. Some algorithms discretize illumination into independent source points and the patterning device pattern into diffraction orders in the spatial frequency domain, and separately formulate a cost function (which is defined as a function of selected design variables) based on process window metrics such as exposure latitude which could be predicted by optical imaging models from source point intensities and patterning device diffraction orders. The term "design variables" as used herein comprises a set of parameters of an apparatus or a device manufacturing process, for example, parameters a user of the lithographic apparatus can adjust, or image characteristics a user can adjust by adjusting those parameters. It should be appreciated that any characteristics of a device manufacturing process, including those of the source, the patterning device, the projection optics, and/or resist characteristics can be among the design variables in the optimization. The cost function is often a non-linear function of the design variables. Then standard optimization techniques are used to minimize the cost function.

A source and patterning device pattern (design layout) optimization method and system that allows for simultaneous optimization of the source and patterning device using a cost function without constraints and within a practicable amount of time is described in a commonly assigned PCT Patent Application Publication No. WO 2010/059954, which is hereby incorporated by reference in its entirety.

Another source and patterning device optimization method and system that involves optimizing the source by adjusting pixels of the source is described in U.S. Pat. No. 8,786,824, which is hereby incorporated by reference in its entirety.

The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic apparatus, no matter where the optical component is located on an optical path of the lithographic apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

The embodiments may further be described using the following clauses:

1. A method comprising:
obtaining a value of a characteristic of a pattern on a substrate produced by a device manufacturing process, using a non-probabilistic model;
obtaining an attribute of a distribution of a residue of the non-probabilistic model;
determining an attribute of a distribution of the characteristic based on the attribute of the distribution of the residue and on the value of the characteristic of the pattern; and
determining a probability that the pattern is a defect, based on the attribute of the distribution of the characteristic.
2. The method of clause 1, wherein the attribute of the distribution of the residue is a probability density function (PDF) of the residue.
3. The method of clause 1, wherein the attribute of the distribution of the residue is a cumulative distribution function (CDF) of the residue.
4. The method of any of clauses 1 to 3, wherein the attribute of the distribution of the residue represents a spread of the distribution of the residue.
5. The method of any of clauses 1 to 4, wherein the attribute of the distribution of the residue is a variance or standard deviation of the distribution of the residue.
6. The method of any of clauses 1 to 5, wherein the characteristic is one or more selected from: a position relative to the substrate, a position relative to one or more other patterns on the substrate, a geometric size, a geometric shape, a measure of a stochastic effect, and/or any combination selected therefrom.
7. The method of any of clauses 1 to 6, wherein determining the attribute of the distribution of the characteristic comprises adding the attribute of the distribution of the residue and the value of the characteristic.
8. The method of any of clauses 1 to 7, wherein the attribute of the distribution of the characteristic is a PDF of the characteristic.
9. The method of clause 8, wherein determining the probability comprises integrating the PDF of the characteristic over a range of the characteristic.
10. The method of any of clauses 1 to 9, further comprising normalizing the attribute of the distribution of the characteristic.
11. The method of any of clauses 1 to 10, wherein determining the attribute of the distribution of the characteristic is further based on a range of the characteristic in which the pattern is considered a defect.
12. A method comprising:
obtaining verified values of a characteristic of a plurality of patterns on a substrate produced by a device manufacturing process;
obtaining computed values of the characteristic using a non-probabilistic model;
obtaining values of a residue of the non-probabilistic model based on the verified values and the computed values; and
obtaining an attribute of a distribution of the residue based on the values of the residue.
13. The method of clause 12, wherein the characteristic is one or more selected from: a position relative to the substrate, a position relative to one or more other patterns on the substrate, a geometric size, a geometric shape, a measure of a stochastic effect, and/or any combination selected therefrom.
14. The method of clause 12 or clause 13, wherein obtaining the verified values comprises measuring the patterns using a metrology tool or simulation using a vigorous model.
15. The method of clause 14, wherein the metrology tool is configured to measure the patterns using a beam of charged particles.
16. The method of any of clauses 12 to 15, wherein obtaining the values of the residue comprises obtaining differences between the computed values and the verified values.
17. The method of any of clauses 12 to 16, wherein the attribute of the distribution of the residue is a PDF of the distribution of the residue.
18. The method of any of clauses 12 to 17, further comprising obtaining the plurality of patterns based on shape, size, function, or spatial proximity.
19. A method comprising:
obtaining probabilities that a set of patterns on a substrate produced by a device manufacturing process are respectively defects;
determining an ordered list of patterns to be inspected based on the probabilities; and
inspecting patterns in the ordered list following an order of the ordered list.
20. The method of clause 19, further comprising obtaining locations of the set of patterns.
21. The method of clause 20, wherein determining the ordered list is further based on the locations.
22. The method of any of clauses 19 to 21, wherein the ordered list comprises a subset of patterns among the set of patterns, wherein patterns in the subset have higher probabilities of being defects than patterns in the set but not in the subset.

23. The method of any of clauses 19 to 22, wherein determining the ordered list is further based on an inspection throughput, an amount of time allowed for inspection, and/or an amount of radiation the substrate is allowed to receive during inspection.

24. The method of any of clauses 19 to 23, wherein the order is an order of descending probabilities.

25. The method of any of clauses 19 to 24, wherein determining the ordered list comprises computing a cost function that is a function of the order.

26. The method of clause 25, wherein the cost function represents the probabilities, an amount of time of inspecting the set of patterns, and/or distances among the set of patterns.

27. The method of any of clauses 19 to 26, further comprising updating the probabilities based on data obtained from inspecting the patterns in the ordered list.

28. A computer program product comprising a non-transitory computer readable medium having instructions recorded thereon, the instructions when executed by a computer system implementing the method of any of clauses 1 to 27.

Although specific reference may have been made above to the use of embodiments in the context of optical lithography, it will be appreciated that an embodiment of the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured. Thus, a lithographic apparatus using the imprint technology typically include a template holder to hold an imprint template, a substrate table to hold a substrate and one or more actuators to cause relative movement between the substrate and the imprint template so that the pattern of the imprint template can be imprinted onto a layer of the substrate.

The descriptions above are intended to be illustrative, not limiting. Thus, it will be apparent to one skilled in the art that modifications may be made as described without departing from the scope of the claims set out below.

What is claimed is:

1. A method comprising:
   obtaining, by a hardware processor, a value of a characteristic of a pattern on a substrate produced by a device manufacturing process, using a non-probabilistic model configured to predict how at least part of the device manufacturing process would perform based on an input pertaining to the device manufacturing process;
   obtaining an attribute of a distribution of a residue of the non-probabilistic model;
   determining an attribute of a distribution of the characteristic based on the attribute of the distribution of the residue and on the value of the characteristic of the pattern; determining a probability that the pattern is a defect, based on the attribute of the distribution of the characteristic; and
   outputting the probability, or data derived therefrom, for use in or with configuration of a physical measurement process or use in or with configuration of the device manufacturing process.

2. The method of claim 1, wherein the attribute of the distribution of the residue is a probability density function (PDF) of the residue.

3. The method of claim 1, wherein the attribute of the distribution of the residue is a cumulative distribution function (CDF) of the residue.

4. The method of claim 1, wherein the attribute of the distribution of the residue represents a spread of the distribution of the residue.

5. The method of claim 1, wherein the attribute of the distribution of the residue is a variance or standard deviation of the distribution of the residue.

6. The method of claim 1, wherein the characteristic is one or more selected from: a position relative to the substrate, a position relative to one or more other patterns on the substrate, a geometric size, a geometric shape, a measure of a stochastic effect, and/or any combination selected therefrom.

7. The method of claim 1, wherein determining the attribute of the distribution of the characteristic comprises adding the attribute of the distribution of the residue and the value of the characteristic.

8. The method of claim 1, wherein the attribute of the distribution of the characteristic is a probability density function (PDF) of the characteristic.

9. The method of claim 8, wherein determining the probability comprises integrating the PDF of the characteristic over a range of the characteristic.

10. The method of claim 1, further comprising normalizing the attribute of the distribution of the characteristic.

11. The method of claim 1, wherein determining the attribute of the distribution of the characteristic is further based on a range of the characteristic in which the pattern is considered a defect.

12. A method comprising:
    obtaining verified values of a characteristic of a plurality of patterns on a substrate produced by a device manufacturing process;
    obtaining, by a hardware computer, computed values of the characteristic using a non-probabilistic model configured to predict how at least part of the device manufacturing process would perform based on an input pertaining to the device manufacturing process;
    obtaining values of a residue of the non-probabilistic model based on the verified values and the computed values; and
    obtaining an attribute of a distribution of the residue based on the values of the residue; and
    outputting the attribute, or data derived therefrom, for use in or with configuration of a physical measurement process or use in or with configuration of the device manufacturing process.

13. The method of claim 12, wherein the characteristic is one or more selected from: a position relative to the substrate, a position relative to one or more other patterns on the substrate, a geometric size, a geometric shape, a measure of a stochastic effect, and/or any combination selected therefrom.

14. The method of claim 12, wherein obtaining the values of the residue comprises obtaining differences between the computed values and the verified values.

15. A computer program product comprising a non-transitory computer readable medium having instructions therein, the instructions, upon execution by a computer system, configured to cause the computer system to at least:

obtain verified values of a characteristic of a plurality of patterns on a substrate produced by a device manufacturing process;

obtain, computed values of the characteristic using a non-probabilistic model configured to predict how at least part of the device manufacturing process would perform based on an input pertaining to the device manufacturing process;

obtain values of a residue of the non-probabilistic model based on the verified values and the computed values; and obtain an attribute of a distribution of the residue based on the values of the residue; and output the attribute, or data derived therefrom, for use in or with configuration of a physical measurement process or use in or with configuration of the device manufacturing process.

16. A computer program product comprising a non-transitory computer readable medium having instructions therein, the instructions, upon execution by a computer system, configured to cause the computer system to at least:

obtain a value of a characteristic of a pattern on a substrate produced by a device manufacturing process, using a non-probabilistic mode configured to predict how at least part of the device manufacturing process would perform based on an input pertaining to the device manufacturing process I;

obtain an attribute of a distribution of a residue of the non-probabilistic model;

determine an attribute of a distribution of the characteristic based on the attribute of the distribution of the residue and on the value of the characteristic of the pattern; and determine a probability that the pattern is a defect, based on the attribute of the distribution of the characteristic; and output the probability, or data derived therefrom, for use in or with configuration of a physical measurement process or use in or with configuration of the device manufacturing process.

17. The computer program product of claim 16, wherein the attribute of the distribution of the residue is a probability density function (PDF) of the residue or a cumulative distribution function (CDF) of the residue.

18. The computer program product of claim 16, wherein the attribute of the distribution of the residue represents a spread of the distribution of the residue.

19. The computer program product of claim 16, wherein the attribute of the distribution of the residue is a variance or standard deviation of the distribution of the residue.

20. The computer program product of claim 16, wherein the characteristic is one or more selected from: a position relative to the substrate, a position relative to one or more other patterns on the substrate, a geometric size, a geometric shape, a measure of a stochastic effect, and/or any combination selected therefrom.

* * * * *